(12) United States Patent
Amai et al.

(10) Patent No.: US 7,063,094 B2
(45) Date of Patent: Jun. 20, 2006

(54) SUBSTRATE PROCESSING APPARATUS

(75) Inventors: Masaru Amai, Tokyo-To (JP);
Masahiro Mukoyama, Nirasaki (JP);
Takayuki Toshima, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 229 days.

(21) Appl. No.: 10/223,686

(22) Filed: Aug. 20, 2002

(65) Prior Publication Data
US 2003/0034056 A1    Feb. 20, 2003

(30) Foreign Application Priority Data
Aug. 20, 2001    (JP) ............................. 2001-248812

(51) Int. Cl.
*B08B 9/02* (2006.01)

(52) U.S. Cl. ............................. 134/104.1; 134/104.2; 134/110; 134/111; 134/902

(58) Field of Classification Search ............ 134/104.2, 134/104.4, 111, 110, 57 R, 58 R, 61, 902, 134/104.1; 210/106, 636
See application file for complete search history.

(56) References Cited

U.S. PATENT DOCUMENTS

| | | | | |
|---|---|---|---|---|
| 3,029,948 A | * | 4/1962 | McKay | 210/771 |
| 3,763,631 A | * | 10/1973 | Horn et al. | 95/154 |
| 4,029,114 A | * | 6/1977 | Wiltrout | 134/104.1 |
| 4,670,150 A | * | 6/1987 | Hsiung et al. | 210/636 |
| 5,240,613 A | * | 8/1993 | Tsuchitani et al. | 210/636 |
| 6,241,827 B1 | * | 6/2001 | Tanaka et al. | 134/18 |
| 6,284,055 B1 | * | 9/2001 | Dryer et al. | 134/10 |
| 6,491,046 B1 | * | 12/2002 | Liang | 134/111 |

FOREIGN PATENT DOCUMENTS

| | | | |
|---|---|---|---|
| DE | 41 27 746 | * | 2/1993 |
| JP | 54-73473 | * | 6/1979 |
| JP | 11-216342 | * | 8/1999 |

* cited by examiner

*Primary Examiner*—Frankie L. Stinson
(74) *Attorney, Agent, or Firm*—Smith, Gambrell & Russell, LLP

(57) ABSTRACT

A substrate processing apparatus includes a substrate processing part 46 for processing a substrate by a processing liquid and a processing-liquid recovery path 137 allowing of a passage of the processing liquid discharged from the substrate processing part 46. The processing-liquid recovery path 137 is provided with foreign substance removal lines 181, 182 including filters 200, 201 for removing an foreign substance from the processing liquid and cleaners 201, 211 for cleaning the filters 200, 201 respectively. With this constitution, it is possible to cancel the blocking of foreign substances in pipes etc. and also possible to lengthen the life span of the filters.

12 Claims, 12 Drawing Sheets

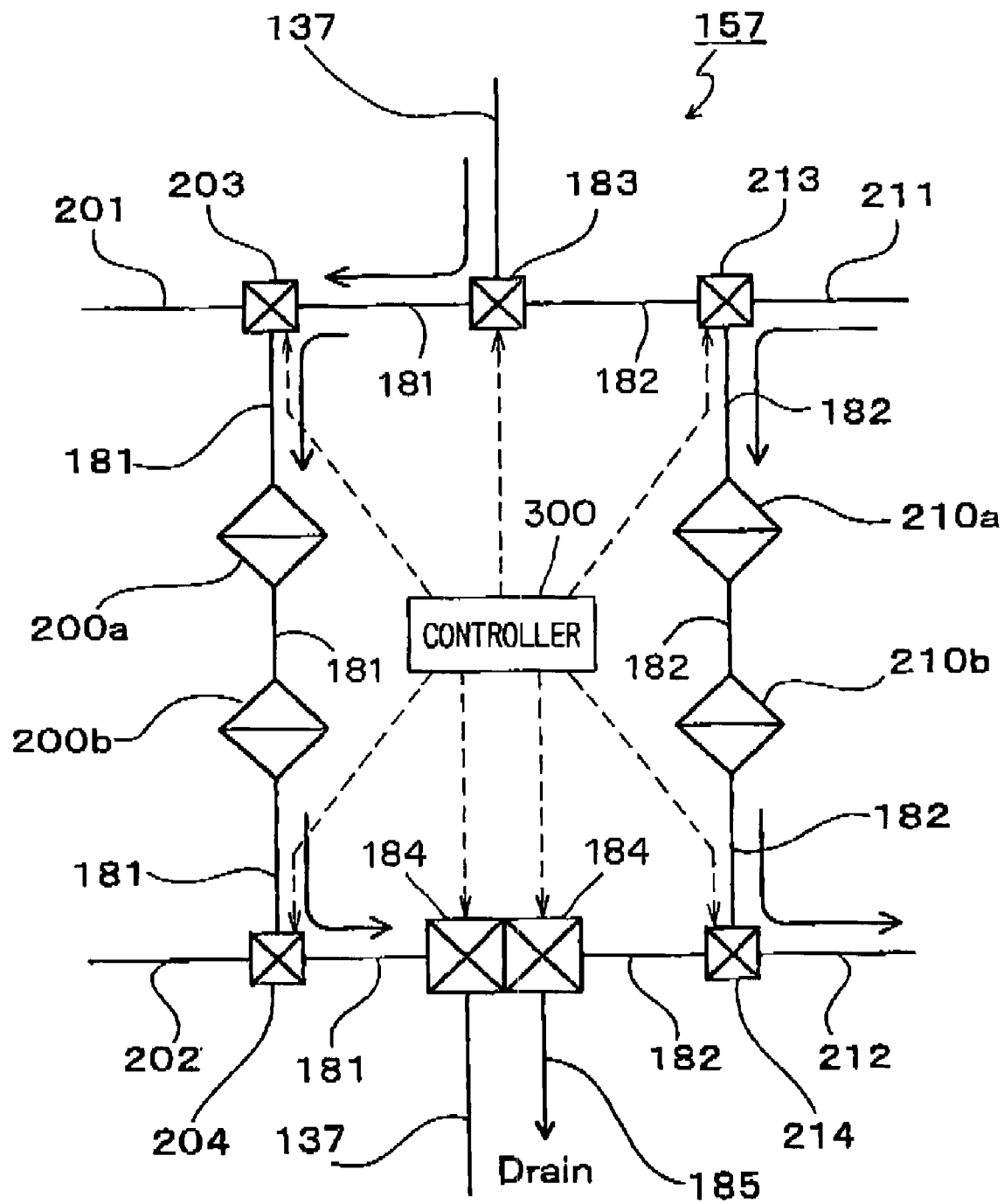
F I G. 13

SUBSTRATE PROCESSING APPARATUS

BACKGROUND OF THE INVENTION

1. Technical Field of the Invention

This invention relates to substrate processing apparatus for cleaning a substrates, for example, semiconductor wafer, glass for LCD glass, etc.

2. Description of the Related Art

For instance, in the manufacturing process of semiconductor devices, it is carried out to clean semiconductor wafers (called as "wafers" hereinafter) by a processing liquid, such as chemical liquid or pure water, in order to remove various contamination, for example, particles, organic pollutant, metallic impurities, etc. from the wafers. For example, when applying a dry-chemical processing on a resist film painted on the wafer, there is formed, on the surface of the resist film, a new resist film which is different from the former resist film in quality and which will be remained as an foreign substance. The foreign substances of the resist film having a changed quality are eliminated by cleaning the wafers after the dry chemical processing. As to the substrate cleaning apparatus performing the above cleaning process, there are known substrate cleaning apparatuses of various kinds, for example, batch-type, single-wafer type, spin-type, etc. In a cleaning system equipped with the substrate cleaning apparatus, there is arranged a circulatory unit for collecting and recycling the processing liquid used in the substrate cleaning apparatus in view of saving the consumption of the processing liquid used for the cleaning operation. For example, the processing liquid discharged from the substrate cleaning apparatus is fed to the circulatory unit through a recovery path and continuously collected into a storage part, for example, a tank in the circulatory unit. The so-collected processing liquid is sucked up by a pump and fed to the substrate cleaning apparatus again. During this recovery process, it is performed to make the so-sucked processing liquid pass through a filter in order to recover the cleanness of the processing liquid for reuse.

However, the conventional substrate cleaning apparatus has a problem that if the cleaning process follows one process which is apt to produce relatively large foreign substances (e.g. dry/chemical process for resist film), the recovery path and pipes in a circulatory system are easy to be blocked with the foreign substances. Therefore, it has been required to clean the pipes etc. frequently. Furthermore, the filter for cleaning the processing liquid has been apt to be blocked with the foreign substances. Therefore, it has been required to exchange the filter frequently, causing the maintenance fee of the apparatus to be raised. Additionally, since the exchange work of the filter and the pipes in the circulatory system requires interrupting the cleaning process of the wafer, the requirement has caused a deterioration of the whole throughput of the apparatus in processing the wafers.

SUMMARY OF THE INVENTION under such a circumference as mentioned above, an object of the present invention is to provide substrate processing apparatus by which it is possible to prevent pipes etc. from being clogged with foreign substances and also possible to lengthen the life span of the filter.

In order to attain the above object to be solved, according to the first aspect of the present invention, there is provided a substrate processing apparatus comprising:

a substrate processing part for processing a substrate by a processing liquid; and a processing-liquid recovery path which allows of a passage of the processing liquid discharged from the substrate processing part, wherein the processing-liquid recovery path is provided with an foreign substance removal line including a filter for removing an foreign substance from the processing liquid and a cleaner for cleaning the filter. According to the substrate processing apparatus constructed above, it is possible to prevent the drain pipes on the downstream side of the foreign substance removal line, pipes in the circulatory system, etc. from being blocked with the foreign substances.

According to the second aspect of the present invention, the processing-liquid recovery path has a plurality of foreign substance removal lines connected with each other in parallel, the plural foreign substance removal lines being selectively adapted so as to allow the processing liquid to flow therethrough. In the substrate processing apparatus constructed above, even if the filter has the foreign substances accumulated from the processing liquid, a liquid-feeding process through the processing-liquid circulatory path can be maintained by switching the flowing of the processing liquid from the above filter to another filter. Additionally, it is possible to clean the filter having the foreign substances accumulated therein while maintaining the liquid-feeding process.

According to the third aspect of the present invention, the substrate processing apparatus further comprises a control unit that controls so as to switch the passage of the processing liquid from one foreign substance removal line to the other foreign substance removal line before the filter in the one foreign substance removal line is deteriorated in terms of its filtering function.

According to the fourth aspect of the present invention, the substrate processing apparatus further comprises a control unit that controls, during the passage of the processing liquid through the filter in one foreign substance removal line, so as to clean the filter in the other foreign substance removal line through which the processing liquid does not pass. In this case, even if the foreign substances are accumulated in the filters it is possible to change the filter to another filter completing the cleaning process.

According to the fifth aspect of the present invention, the cleaner is capable of dissolving an foreign substance mixed in the processing liquid.

According to the sixth aspect of the present invention, the foreign substance to be dissolved is a resist having its nature changed.

According to the seventh aspect of the present invention, a solution for dissolving the foreign substance is any one of hydrogen peroxide, nitric acid and acetic acids According to the eighth aspect of the present invention, the substrate processing apparatus further comprises;

a solution supply path connected to the processing-liquid recovery path on the upstream side of the filter to supply a solution for dissolving the foreign substance mixed into the processing liquid; and a solution drain path connected to the processing-liquid recovery path on the downstream side of the filter to drain the solution. In this case, by allowing the solution to flow in the filter through the solution supply path and the solution drain path, it is possible to clean the filter.

According to the ninth aspect of the present invention, the foreign substance removal line has a plurality of filters interposed therein, one of the filters on the downstream side of the foreign substance removal line being constructed so as to remove a fine foreign substance in comparison with the other filter on the upstream side of the foreign substance removal line.

According to the tenth aspect of the present invention, the processing-liquid recovery path is adapted so as to supply the processing liquid that has passed through the foreign substance removal line to the substrate processing part, in view of reusing the processing liquid. Then, it is possible to save the consumption of the processing liquid.

According to the eleventh aspect of the present invention, the processing-liquid recovery path has a main filter arranged on the downstream side of the foreign substance removal line to clean the processing liquid. In this case, it is possible to remove fine mud substances from the processing liquid where the foreign substances have been removed by the filter in the foreign substance removal line.

According to the twelfth aspect of the present invention, the substrate processing apparatus further comprises:
  a first valve interposed in the processing-liquid recovery path and arranged on the upstream side of the filter;
  a second valve interposed in the processing-liquid recovery path and arranged on the downstream side of the filter;
  a solution supply path connected to the first valve to supply a solution for dissolving the foreign substance mixed into the processing liquid;
  a solution drain path connected to the second valve to drain the solution; and
  a control unit for controlling the operations of the first valve and the second valve in a manner that, when removing the foreign substance from the processing liquid by the filter, the control unit allows the processing liquid to pass from the upstream side of the processing-liquid recovery path to the downstream side of the processing-liquid recovery path through the filter and that, when dissolving the foreign substance accumulated in the filter, the control unit allows the solution to pass from the solution supply path to the solution drain path through the filter in the processing-liquid recovery line.

According to the thirteenth aspect of the present invention, the substrate processing apparatus of the twelfth aspect further comprises:
  a third valve interposed in the processing-liquid recovery path and arranged on the downstream side of the second valve; and
  a processing-liquid drain path connected to the third valve to drain the processing liquid, wherein
  the control unit controls the operation of the third valve in a manner that, when recovering the processing liquids the control unit allows the processing liquid to flow from the upstream side of the processing-liquid recovery path to the downstream side of the processing-liquid recovery path through the third valve and that, when draining the processing liquid, the control unit allows the processing liquid to flow from the upstream side of the processing-liquid recovery path to the processing-liquid drain path through the third valve.

According to the fourteenth aspect of the present invention, the substrate processing apparatus of the twelfth aspect further comprises:
  a fourth valve interposed in the processing-liquid recovery path and arranged on the upstream side of the first valve;
  a fifth valve interposed in the processing-liquid recovery path and arranged on the downstream side of the second valve;
  a parallel path arranged in parallel with the processing-liquid recovery path to connect the fourth valve with the fifth valve, the parallel path including a "parallel-path side" filter;
  a sixth valve interposed in the parallel path and arranged between the "parallel-path side" filter and the fourth valve;
  a "parallel-path side" solution supply path connected to the sixth valve to supply a solution for dissolving the foreign substance mixed into the processing liquid;
  a seventh valve interposed in the parallel path and arranged between the "parallel-path side" filter and the fifth valve; and
  a "parallel-path side" solution drain path connected to the seventh valve to drain the solution, wherein
  the control unit controls the operations of the first valve, the second valve, the fourth valve, the fifth valve, the sixth valve and the seventh valve
  in a manner that;
  when removing the foreign substance from the processing liquid by the filter and also dissolving the foreign substance accumulated in the "parallel-path side" filter by the solution, the control unit allows the processing liquid to flow in the processing-liquid recovery path through the fourth valve, the first valve, the filter, the second valve and the fifth valve, in order and also allows the solution to flow from the "parallel-path side" solution supply path to the "parallel-path side" solution drain path via the sixth valve, the "parallel-path side" filter and the seventh valve, in order; and
  when removing the foreign substance from the processing liquid by the "parallel-path side, filter and also dissolving the foreign substance accumulated in the filter by the solution, the control unit allows the processing liquid to flow in the processing-liquid recovery path through the fourth valve, the sixth valve, the "parallel-path side" filter, the seventh valve and the fifth valve, in order; and also allows the solution to flow from the "parallel-path side" solution supply path to the parallel-path side" solution drain path via the first valve, the filter and the second valve, in order.

Again, according to the present invention, there is also provided a substrate processing method of processing a substrate by a processing liquid and also allowing the processing liquid discharged after processing to pass through a filter, the method comprising the steps of: allowing the processing liquid to pass through the filter when the substrate is being processed, and cleaning the filter when the substrate is not processed. According to the present method, even if the foreign substances are accumulated in the filter, it is possible to clean the same filter while the processing liquid is not passing through the filter.

Further, according to the present invention, there is also provided a substrate processing method of processing a substrate by a processing liquid and also allowing the processing liquid discharged after processing to pass through any one of plural filters, the method comprising the step of: switching the filter allowing of the passage of the processing liquid from one filter to the other filter; and cleaning the former filter where the processing liquid is not passing through. According to the present method, even if the foreign substances are accumulated in the filter which allowed of the passage of the processing liquid during the discharging process of the processing liquid, it is possible to maintain the discharging process by changing the flow of the processing liquid so that the processing liquid passes through the other filter. In the meantime, it is possible to clean the filter having the foreign substances accumulated therein.

It is preferable to clean the filter that allowed of the passage of the processing liquid while the processing liquid is passing through the other filter. In this case, even if the foreign substances are accumulated in the other filter, it is possible to switch from the present filter to a new filter completing the cleaning process.

According to the substrate processing method, preferably, the process of cleaning the filter is to dissolve the foreign substances, which have been separated from the processing liquid by the filter, by using the solution.

BRIEF DESCRIPTION OF THE DRAWINGS

FIG. 13 is an explanatory view of the foreign substance removing part provided with a plurality of filters.

DESCRIPTION OF THE PREFERRED EMBODIMENT

Figure 1:
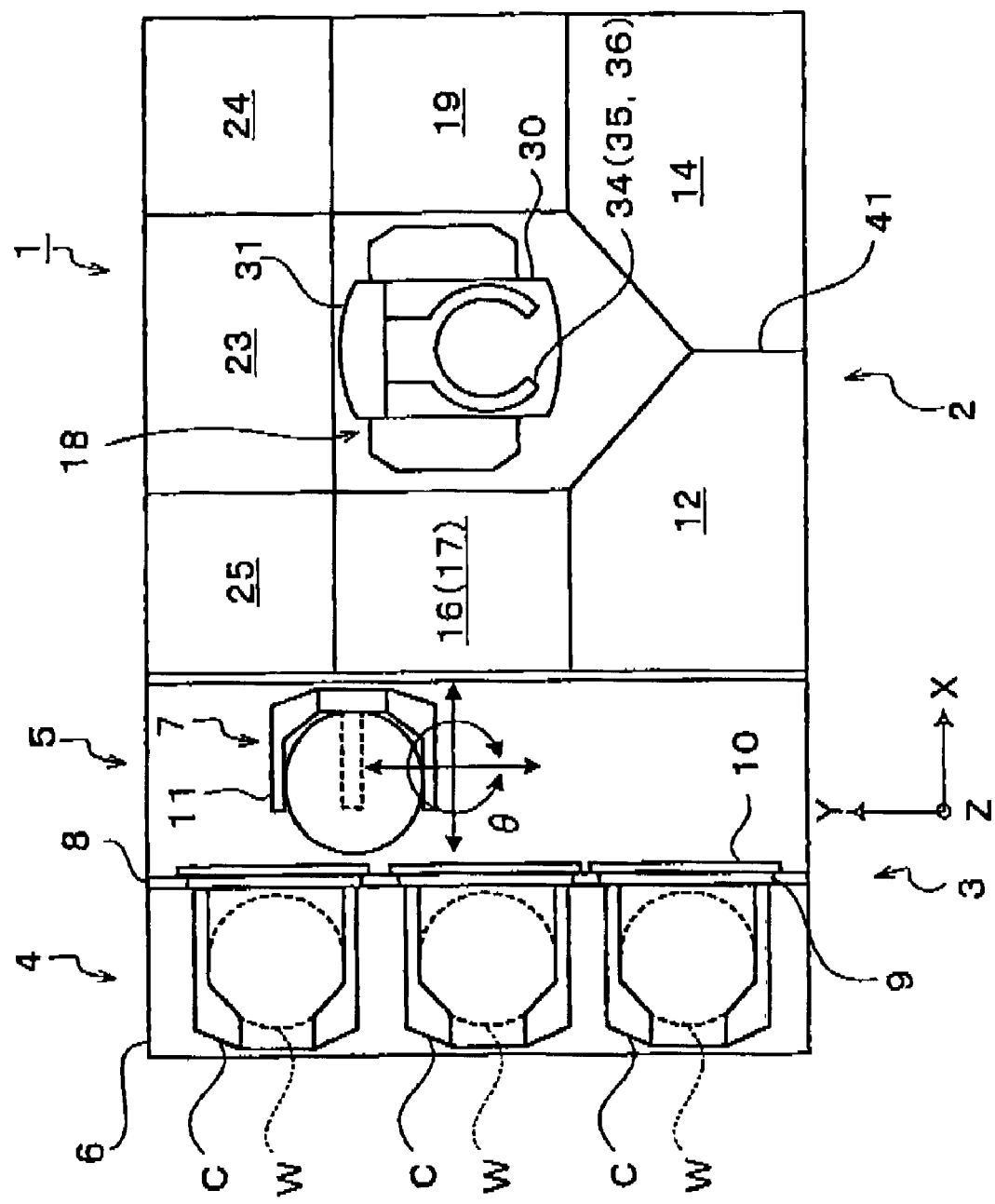
FIG. 1 is a plan view of a substrate cleaning system.
Figure 2:
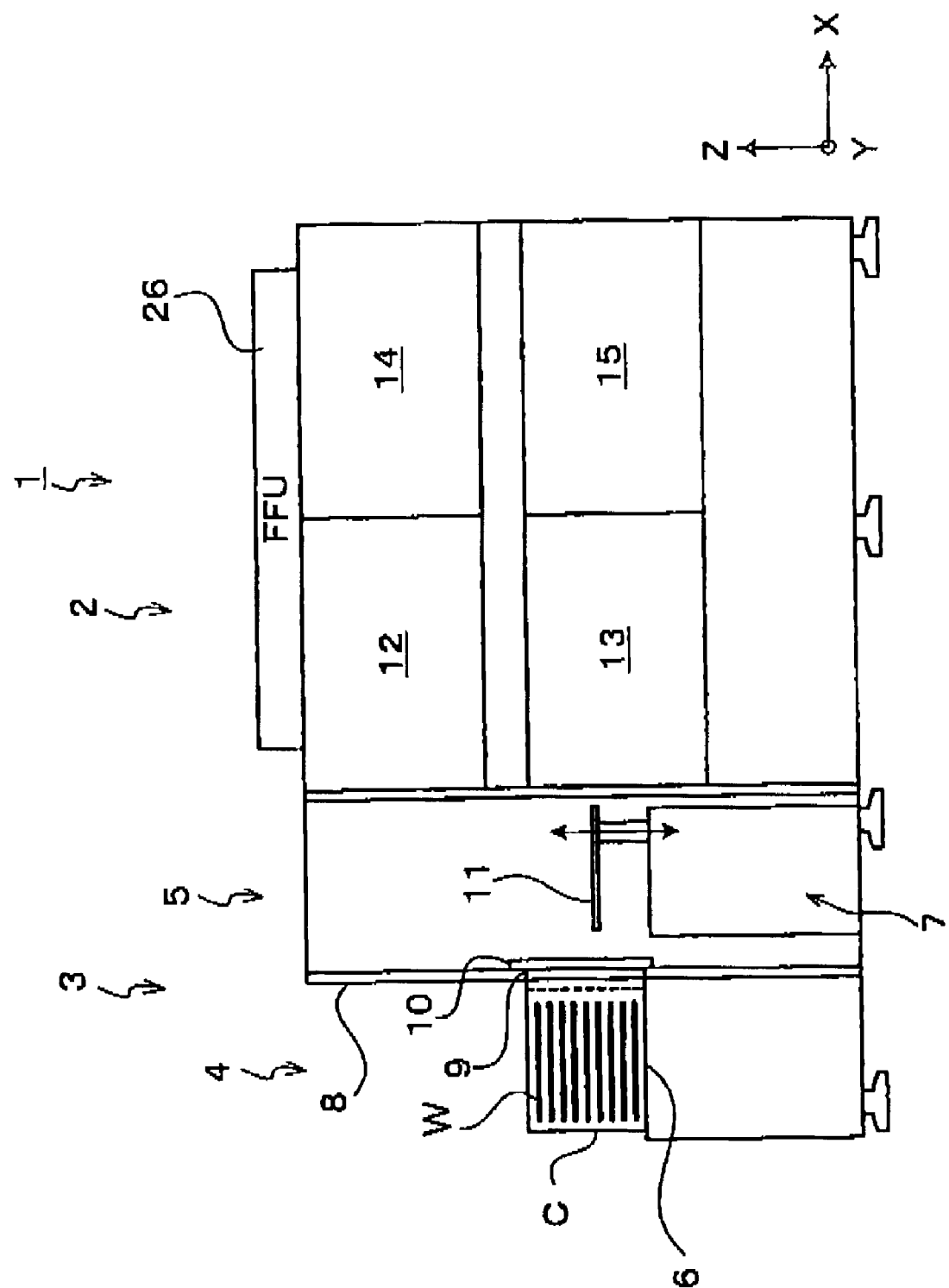
FIG. 2 is a side view of the substrate cleaning system.

Based on a substrate cleaning unit (as the substrate processing apparatus) which is constructed so as to clean both surfaces of a wafer (as one example of substrate), one preferred embodiment of the present invention will be described below. FIG. 1 is a plan view of the cleaning system 1 having built-in substrate cleaning units 12, 13, 14, 15 in accordance with the embodiment of the invention. FIG. 2 is a side view of FIG. 1. The cleaning system 1 includes a cleaning part 2 for carrying out cleaning process for wafers W and subsequent heat treatment after cleaning and a loading/unloading part 3 for loading and unloading the wafers W to and from the cleaning part 2.

The loading/unloading part 3 is formed by an in/out port 4 provided with a mounting table 6 for mounting a container (carrier C) thereon and a wafer-transfer part S equipped with a wafer transfer unit 7 for carrying out the delivery of wafer between the carrier C mounted on the mounting table 6 and a cleaning part 2. The carrier C is capable of accommodating a plurality of wafers W (for example, twenty-five wafers) generally horizontally, at predetermined intervals.

The wafers W are loaded or unloaded through one side face of the carrier C. The carrier C is provided, on the side face, with a lid body that can open and shut the carrier. The carrier C has a plurality of shelf plates formed on its inner wall to retain the wafers W thereon at predetermined intervals, providing twenty-five slots for accommodating the wafers therein. While positioning the wafers' surfaces (i.e. surfaces for forming semiconductor devices) so as to face upward, the wafers W are accommodated in the slots, one by one.

The mounting table 6 of the in/out port 4 is capable of mounting e.g. three carriers C juxtaposed in a direction Y on the horizontal plane of the table, at predetermined positions. The carriers C are mounted on the table 6 so that their side faces having the lid bodies face a boundary wall 8 between the in/out port 4 and the wafer transfer part 5. The boundary wall 8 is provided, at positions corresponding to the mounting positions of the carriers C, with windows 9. On each window's side facing the wafer transfer part 5, there is arranged a window opening mechanism 10 that opens and closes the corresponding window 9 by means of a shutter etc.

This window opening mechanism 10 is also capable of opening and closing the lid body of the carrier C. The window opening mechanism 10 opens or closes the lid body of the carrier C at the same time of opening or closing the window 9. Preferably, the window opening mechanism 10 is provided with an interlocking unit that prohibits the mechanism from operating when the carrier C is not arranged at a designated position on the mounting table. When the window 9 is opened to communicate the loading/unloading port of the carrier C with the wafer transfer part 5, it becomes possible for the wafer transfer unit 7 in the wafer transfer part 5 to gain access to the carrier C, allowing of the transportation of the wafer W. on the top of the window 9, a not-shown wafer detecting device is arranged to detect the number of wafers W accommodated in the carrier C and also their conditions every slot. Alternatively, the wafer detecting device may be equipped with the window opening mechanism 10.

The wafer transfer unit 7 in the wafer transfer part 5 is movable in both Y-direction and Z-direction and also rotatable in a plane of X-Y (e-direction). The wafer transfer unit 7 includes a pickup/accommodating arm 11 for grasping the wafer W. The pickup/accommodating arm 11 is slidable in a direction of x. In this way, the wafer transfer unit 7 can obtain access to a slot at any height of all the carriers C mounted on the mounting table 6 and also access to two upper and lower wafer delivery units 16, 17 arranged in the cleaning part 2, allowing the wafer W to be transferred from the in/out port 4 to the cleaning part 2, and vice versa.

The cleaning part 2 includes a main wafer transfer unit 18, two wafer delivery units 16, 17, four substrate cleaning units 12, 13, 14, 15 of this embodiment, and a heating and cooling part 19 consisting of three heating units for heating the wafers W after cleaning and a cooling unit for cooling the heated wafers W. The main wafer transfer unit 18 is arranged to give access to all of the wafer delivery units 16, 17, the substrate cleaning units 12, 13, 14, 15, the heating and cooling part 19.

In the cleaning part 2, there are arranged a battery unit 23 as a power source for working the whole cleaning system 1, a mechanical control unit 24 for controlling the operations of various sorts of devices in the cleaning system 1 and also the operation of the system 1 as a whole and a chemical storage unit 24 for storing designated cleaning liquids to be supplied to the substrate processing units 12, 13, 14, 15. The battery unit 23 is connected with a not-shown main power source. On the ceiling part of the cleaning part 2, a fan filter unit (FFU) 26 is arranged to supply the above units and the main wafer transfer unit 18 with downward-flowing fresh air.

By either arranging the battery unit 23, the chemical storage unit 25 and the mechanical control unit 24 outside the cleaning part 2 or withdrawing these units 23, 24, 25 from the part 2, the arrangement facilitates maintenance of the wafer delivery units 16, 17, the main wafer transfer unit 18, the heating and cooling part 19, from this plane (Y-direction).

The wafer delivery units 16, 17 are provided to temporarily mount the wafer W thereon in order to accomplish the delivery of the wafer W between the units 16, 17 and the wafer transfer part 5. The wafer delivery units 16, 17 are stacked up in two stages up and down. For example, the wafer delivery unit 17 on the lower stage is used to mount the wafer W to be transferred from the in/out port 4 to the cleaning part 2, while the wafer delivery unit 16 on the upper stage is used to mount the wafer W to be transferred from the cleaning part 2 to the in/out port 4.

The downward flow from the fan filter unit (FFU) 26 partially passes through the wafer delivery units 16, 17 and also their upside space and flows into the wafer transfer part 5. consequently, it is possible to prevent particles etc. from invading the cleaning part 2 through the wafer transfer part 2, thereby maintaining the cleanness in the cleaning part 2.

The main wafer transfer unit 18 includes a cylindrical holder 30 which can rotate owing to the rotational driving force of a not-shown motor and a wafer transfer body 31 which can move up and down in the direction of Z along the inside of the holder 30. The wafer transfer body 31 is rotated in a body with the holder so. The wafer transfer body 31 is equipped with three transfer arms 34, 35, 36 which are arranged in multistage and also movable in front and in the rear independently of each other.

In the heating-and-cooling part 19, there is arranged one cooling unit which cools the wafer W forcibly and on which three heating units for forcible heating and natural cooling are piled up one after another. Alternatively, there may be arranged the heating-and-cooling part 19 in a space defined above the wafer delivery units 16, 17. Then, it becomes possible to divert a space (shown in FIG. 1) occupied by the heating-and-cooling part 19 to another utility space.

As shown in FIG. 2, the substrate cleaning units 12, 13, 14, 15 are arranged in two stages vertically. As shown in FIG. 1, the substrate cleaning units 12, 13 and the substrate cleaning units 14, 15 are symmetrical to each other on both sides of a wall 41 as the boundary of symmetry. Besides this symmetrical arrangement, these substrate cleaning units 12, 13, 14, 15 are provided with structures similar to each other. Therefore, the detailed structures will be described below, by example of the substrate cleaning unit 12.

Figure 3:
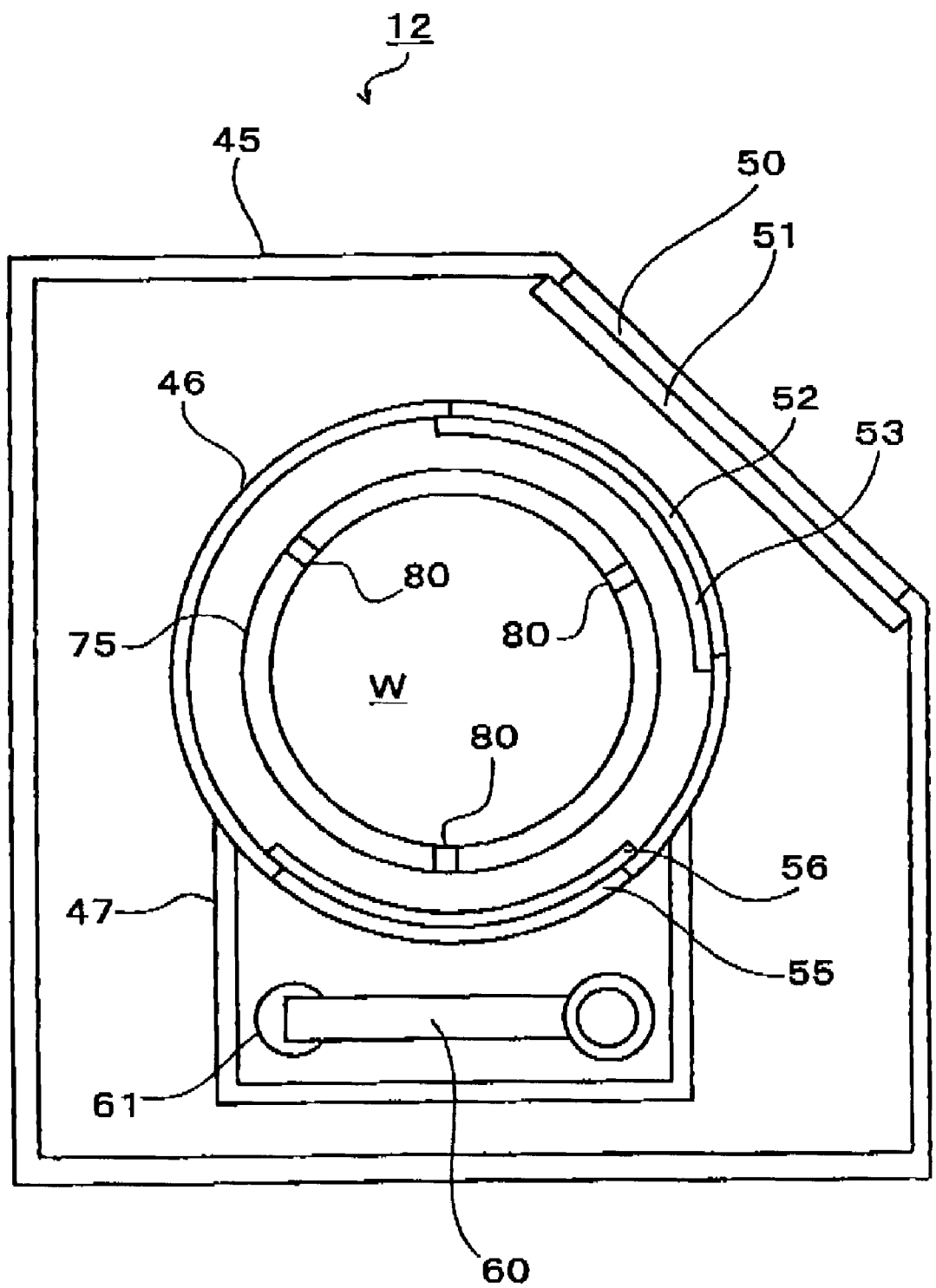
FIG. 3 is a plan view of a substrate cleaning unit of an embodiment of the present invention.

FIG. 3 is a plan view of the substrate cleaning unit 12. The substrate cleaning unit 12 is provided, in a "unit" chamber 45 thereof, with an outer chamber 46 for accommodating the wafer W therein and further processing it with a processing liquid, and an nozzle housing 47. An opening 50 is formed in the "unit" chamber 45. The "unit" chamber 45 is provided with a mechanical shutter 51 that opens and closes the opening 50 by means of a not-shown closing mechanism. When the transfer arm 34 loads or unloads the wafer W into or from the substrate cleaning unit 12 through the opening 45, the mechanical shutter 51 opens. The mechanical shutter 51 for the unit chamber is adapted so as to open and close the opening 50 on the interior side of the "unit" chamber 45.

Thus, even if a positive pressure is formed in the "unit" chamber 45, an atmosphere inside the "unit" chamber 45 does not leak out.

An opening 52 is formed in the outer chamber 46. The outer chamber 46 is provided with a mechanical shutter 53 that opens and closes the opening 52 by means of a not-shown cylinder driving mechanism. When the wafer W is loaded to or unloaded from the outer chamber 46 through the opening 52 by e.g. the transfer arm 34, an "outer-chamber" mechanical shutter 53 does open. The "outer-chamber" mechanical shutter 53 may be constructed so as to open and close by a common closing mechanism with the "unit-chamber" mechanical shutter 51. Further, the "outer-chamber" mechanical shutter 53 is adapted so as to open and close the opening 52 on the interior side of the outer chamber 46. Thus, even if a positive pressure is formed in the outer chamber 46, an atmosphere inside the outer chamber 43 does not leak out. An opening 55 is formed in the nozzle housing 47. The nozzle housing 47 is provided with a "nozzle-housing" shutter 56 that opens and closes the opening 55 by means of a not-shown driving mechanism. When the nozzle housing 47 is insulated from the outer chamber 46 in terms of atmosphere therein, the "nozzle-housing" shutter 50 does close.

Accommodated in the nozzle housing 47 is a processing-liquid nozzle 60 which can eject $N_2$-gas, IPA, pure water and an foreign substance solution. Being accommodated in the outer chamber 46, the processing-liquid nozzle 60 is capable of scanning from at least the center of the wafer W held by a later-mentioned spin chuck 71 up to the periphery of the wafer W. The processing-liquid nozzle 60 takes shelter in the nozzle housing 47 except during the processing operation. Further, the nozzle housing 47 is provided with a nozzle cleaning unit (nozzle cleaner) 61 for cleaning the processing-liquid nozzle 60.

Figure 4:
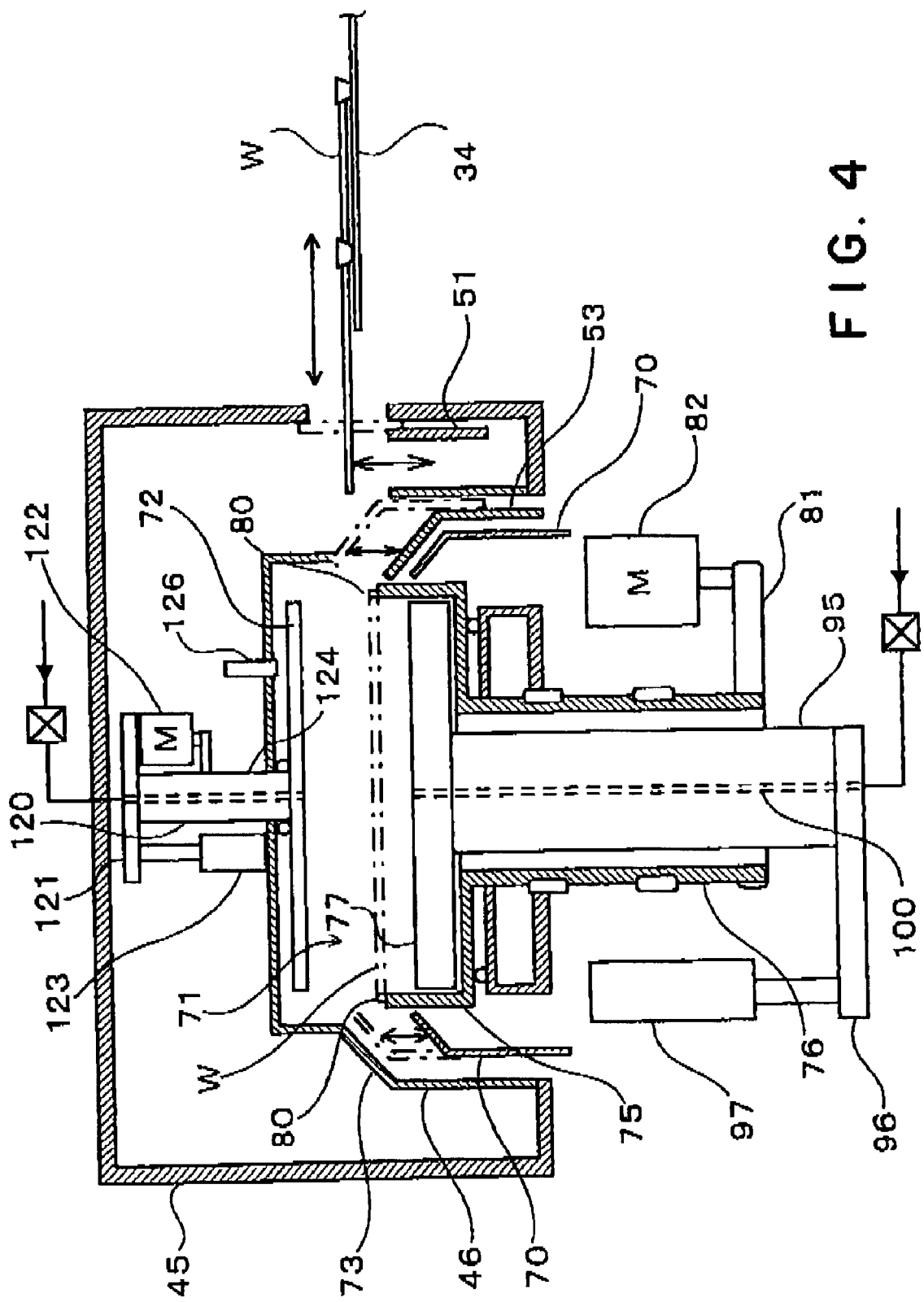
FIG. 4 is a longitudinal sectional view of the substrate cleaning unit of an embodiment of the present invention.

As shown in FIG. 4, the outer chamber 46 includes an inner cup 70 for accommodating the wafer W, a spin chuck 11 for holding the wafer W rotatably while allowing the surface of the wafer W to look upward and a top plate 72 that moves up and down in relation to the upper face of the wafer W (the surface of the wafer W) being held by the spin chuck 71. The outer chamber 46 has a slanted part 73 formed at a level of the wafer W supported by the spin chuck 71. Thus, the wafer W is surrounded by the slanted part 73. Note, the upper portion of the "outer-chamber" mechanical shutter 53 constitutes a part of the slanted part 73. Therefore, when it is required to transfer the wafer W with respect to the spin chuck 71, the "outer-chamber" mechanical shutter 53 has only to be opened with a horizontal movement of the wafer W.

The spin chuck 71 includes a chuck body 73 for holding the wafer W and a rotating cylinder 74 connected with the bottom of the chuck body 73. Disposed in the chuck body 73 is an under plate 75 which moves up and down with respect to the under face (back face) of the wafer W held by the spin chuck 71, relatively.

The upper part of the chuck body 73 is equipped, at several positions, with not-shown support pins for supporting the peripheral part of the back face of the wafer W and holding members 80 for holding the peripheral part of the wafer W. In the shown example, three holding members 80 are arranged at intervals of 120 degrees in the circumference of the chuck body 73. Thus, the periphery of the wafer W can be held by these members 76. Further, the chuck body 73 is provided, at intervals of 120 degrees in the circumference of the wafer W, with three support pins which support the wafer W from the underside and which are not shown in the figure.

A belt 81 is wound about the circumferential face of the rotating cylinder 76. Owing to the driving of a motor 82, the resulting circumferential movement of the belt 81 allows the spin chuck 71 to be rotated as a whole. As shown in FIG. 3, the holding members 80 are adapted so as to hold the peripheral part of the wafer W from the outside owing to centrifugal force produced by the rotation of the spin chuck 71. When the spin chuck 71 comes to a standstill, the above support pins support the back face of the wafer W. While, when the spin chuck 71 is rotating, the holding members 80 hold the peripheral part of the wafer W.

As shown in FIG. 4, the under plate 77 is connected with the top of an under-plate shaft 95 penetrating the chuck body 76 and the rotating cylinder 76. The under-plate shaft 95 is secured on the upper face of a horizontal plate 96. By an elevating mechanism 97, such as air cylinder, the horizontal plate 96 is moved up and down in the vertical direction, in one body with the under-plate shaft 95. Accordingly, the under plate 77 can be lowered in the chuck body 75 into a condition where the plate 77 are waiting in readiness apart from the under face of the wafer W held by the spin chuck 71 (see FIG. 4; withdrawal position). While, the under plate 77 can be also elevated in the chuck body 75 into a condition where the under face of the wafer W held by the spin chuck 71 is being cleaned (see FIG. 11; processing position). Alternatively, there may be provided the under plate 77 which is movable between the processing position and the withdrawal position by the following steps of: fixing the under plate 77 at a designated level; connecting the rotating cylinder 76 with a not-shown elevating mechanism; and moving the whole spin chuck 71 up and down.

The under plate 75 is provided with a lower supply path 100 which penetrates the under-plate shaft 95 to supply a clearance between the lower face of the wafer W and the plate 75 with the processing liquids (e.g. chemical liquids, IPA, pure water), $N_2$-gas and so on. In the under plate 77, there is provided a not-shown "under-plate" heat regulator that adjusts a temperature of the chemical liquid, which has been supplied on the lower face of the wafer W through the lower supply path 100, to a designated temperature.

The top plate 72 is connected with the lower end of a rotating shaft 120 and rotated by a motor 122 mounted on a horizontal plate 121. The rotating shaft 120 is rotatably supported on the lower face of the horizontal plate 121. The horizontal plate 121 can move up and down in the vertical direction by a shaft-elevating mechanism 123, such as air cylinder, secured on the top of the outer chamber. Therefore, owing to the operation of the shaft-elevating mechanism 123, the top plate 72 is movable up and down between a condition where the plate 72 are waiting in readiness apart from the upper face of the wafer W held by the spin chuck 71 (see FIG. 4; withdrawal position) and another condition where the plate 72 adjoins the upper face of the wafer W held by the spin chuck 71 (see FIG. 11; processing position).

The top plate 72 is provided with an upper supply path 124 penetrating the rotating shaft 120, which allows of selective supply of the processing liquids (e.g. chemicals, pure water), dry gas, etc. into a clearance between the upper face of the wafer W and the top plate 72. In the top plate 72, there is also provided a not-shown "top-plate" heat regulator that adjusts a temperature of the chemical liquid, which has been supplied on the upper face of the wafer W through the upper supply path 120, to a designated temperature. The outer chamber 46 is equipped, on its top, with a $N_2$-gas supplier 126 to eject $N_2$-gas between the upper face of the top plate 72 and the interior of the outer chamber 46.

The inner cup 70 can be lowered to a position of FIG. 4, establishing a condition where the spin chuck 71 is projected from the upper end of the inner cup 70 to allow of the delivery of the wafer W. While, the inner cup 70 can be also elevated to a position of FIG. 11, establishing another condition to surround the spin chuck 71 and the wafer W. Additionally, when the inner cup 70 moves down, there is also established a condition where the outer chamber 46 serves to prevent the processing liquids supplied to both faces of the wafer W from splashing around. On the other hand, when the inner cup 70 moves up, there is also established a condition where the inner cup 70 per se serves to prevent the processing liquids supplied to both faces of the wafer W from splashing around.

Figure 5:
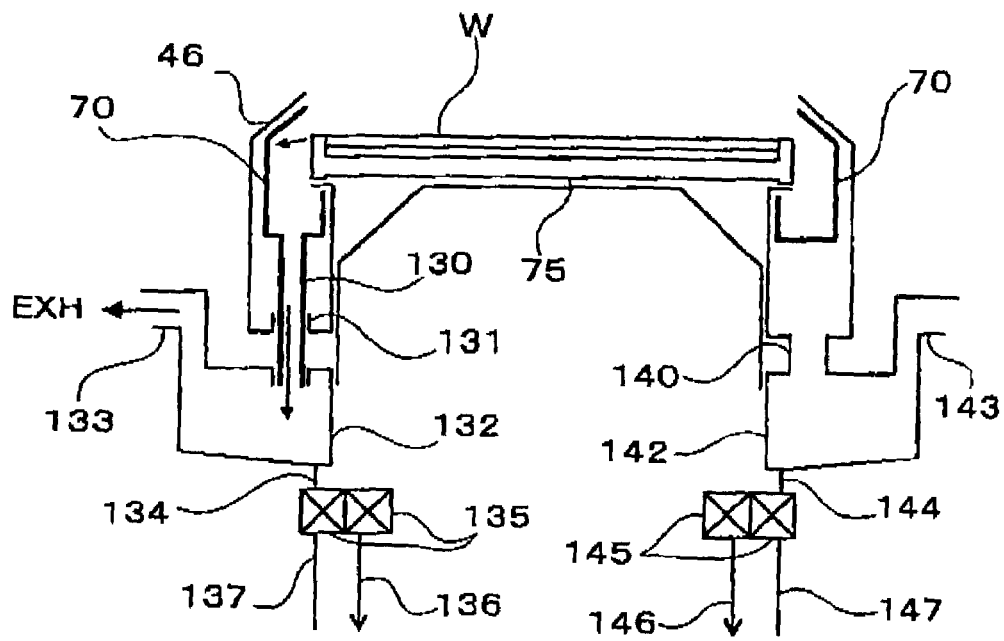
FIG. 5 is an explanatory view of a process of discharging liquid drops from an inner cup to a mist trap.
Figure 6:
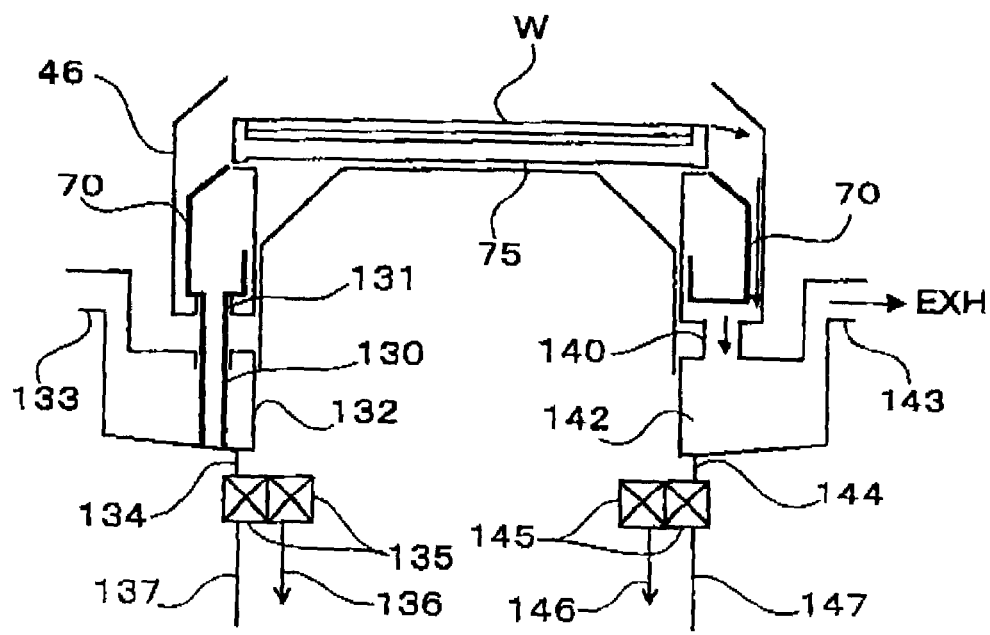
FIG. 6 is an explanatory view of a process of discharging liquid drops from an outer chamber to a mist trap.

As shown in FIGS. 5 and 6, an "inner-cup" drain pipe 130 is connected with the bottom of the inner cup 70 to discharge liquid drops in the inner cup 70. The "inner-cup" drain pipe 130 is movable up and down through a through-port 131 formed on the bottom of the outer chamber 46. The lower end of the "inner-cup" drain pipe 130 is inserted into an "inner-cup" mist trap 132. Owing to the provision of the "inner-cup" mist trap 132, it becomes possible to remove air-bubbles in the liquid drops discharged from the inner cup 70. The air bubbles on removal are discharged through a mist-trap exhaust pipe 133 connected with the "inner-cup" mist trap 132. The liquid drops after the removal of air bubbles pass through an "inner-cup" drain pipe 134 connected to the "inner-cup" mist trap 132. Since the chemical liquids are discharged into the inner cup 70, the "inner-cup" drain pipe 134 is connected to a drain pipe 136 and a chemical discovery path 137 through a switching valve 135.

An "outer-chamber" drain pipe 140 is connected with the bottom of the outer chamber 46 to drain the liquid drops therefrom. The "outer-chamber" drain pipe 140 is provided with an "outer-chamber" mist trap 142 which eliminates air bubbles from the liquid drops drained from the mist trap 142. The air bubbles on removal are discharged into the outside through an "outer-chamber" mist-trap exhaust pipe 143 connected with the "outer-chamber" mist-trap 142. The liquid drops after the removal of air bubbles pass through an "outer-chamber" drain pipe 144 connected to the "outer-chamber" mist trap 142. Since a liquid of IPA is discharged into the outer chamber 46, the "outer-chamber" drain pipe 144 is connected to a drain pipe 146 and an IPA discovery path 147 through a switching valve 145.

When the inner cup 70 drops, as shown in FIG. 6, there is obtained a condition where the spin chuck 71 and the wafer W held by the chuck 71 project from the upper end of the inner cup 70 upward. Then, the liquid drops in the outer chamber 46 moves down outside the inner cup 70 and is drained through the "outer-chamber" drain pipe 140. On the other hand, when the inner cup 70 is elevated as shown in FIG. 5, there is obtained a condition where the inner cup 70 surrounds the spin chuck 71 and the wafer W thereby to prevent the cleaning liquids etc. supplied to both faces of the wafer W from splashing around. Then, the upper part of the inner cup 70 approaches the inner wall of the outer chamber 46, so that the liquid drops in the inner cup 70 are drained through the "inner-cup" drain pipe 130.

Figure 7:
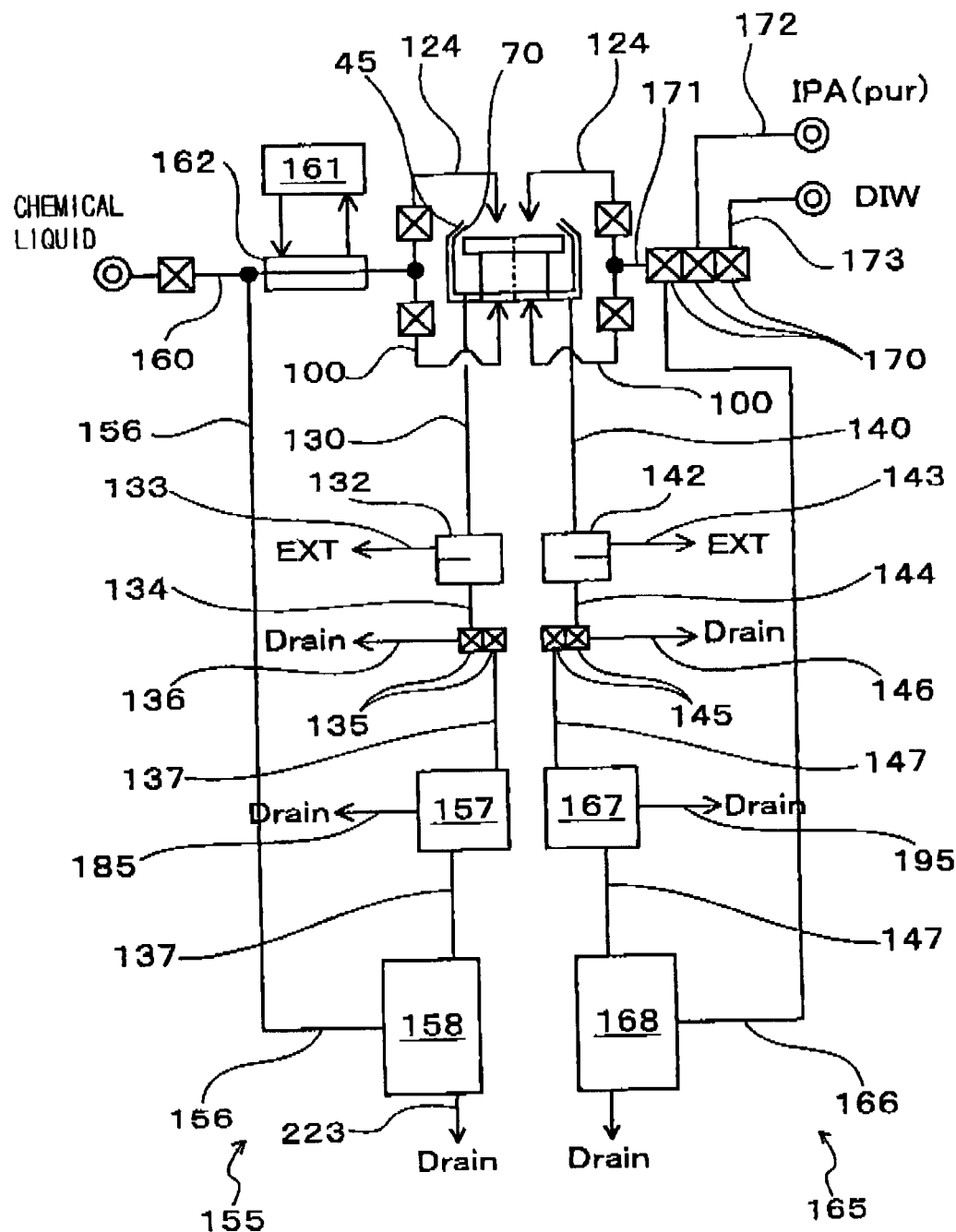
FIG. 7 is an explanatory view of a circulatory mechanism of chemical liquid and IPA.

FIG. 7 is a view for explanation of a circulatory mechanism of the processing liquids. A chemical feed line 155 allowing of the passage of the processing liquid from the inner cup 70 in the outer chamber 46, is formed by a chemical recovery path 137 and a chemical circulatory path 156. The chemical recovery path 137 is provided with an foreign substance removal part 157 for removing foreign substances from the chemical liquid. The chemical recovery path 137 is connected with a chemical circulatory unit 158 that recovers the chemical liquid for circulation. The chemical circulatory path 156 is connected with the chemical circulatory unit 158. The chemical circulatory path 156 is also connected with a chemical supply path 160. The chemical supply path 160 is connected with the upper supply path 124 and the lower supply path 100. The chemical supply path 160 is provided with a heat regulator 162 which can control a temperature of the chemical liquid flowing in the path 160 by means of a heater 161, for example. With the above-mentioned circulatory mechanism, the chemical liquid after the cleaning process of the wafer W is collected and subsequently used for the cleaning process of the wafer W again.

An IPA feed line 165 allowing of the passage of the IPA liquid from the outer chamber 46 is formed by an IPA recovery path 147 and an IPA circulatory path 166. The IPA recovery path 147 is provided with an foreign substance removal part 167 for removing foreign substances from the IPA liquid. The IPA recovery path 147 is connected with an IPA circulatory unit 168 that recovers the IPA liquid for circulation. The IPA circulatory path 166 is connected with the IPA circulatory unit 168. The IPA circulatory path 166 is also connected with an IPA supply path 171 through a supply-switching valve 170. The IPA supply path 171 is connected with the processing-liquid nozzle 60 and the lower supply path 100. With the above-mentioned circulatory mechanism, the IPA liquid after processing the wafer W is collected and subsequently used for the processing of the wafer W again. By the supply-switching valve 170, the IPA liquid to be supplied to the wafer W can be switched between the unused IPA liquid (pur) supplied through the IPA supply path 172 and the IPA liquid (rec) collected by the IPA circulatory unit 168. Further, owing to the switching operation of the supply-switching valve 170, it is possible to supply the processing-liquid nozzle 60 and the lower supply path 100 with pure water supplied from a pure-water supply path 173.

Figure 8:
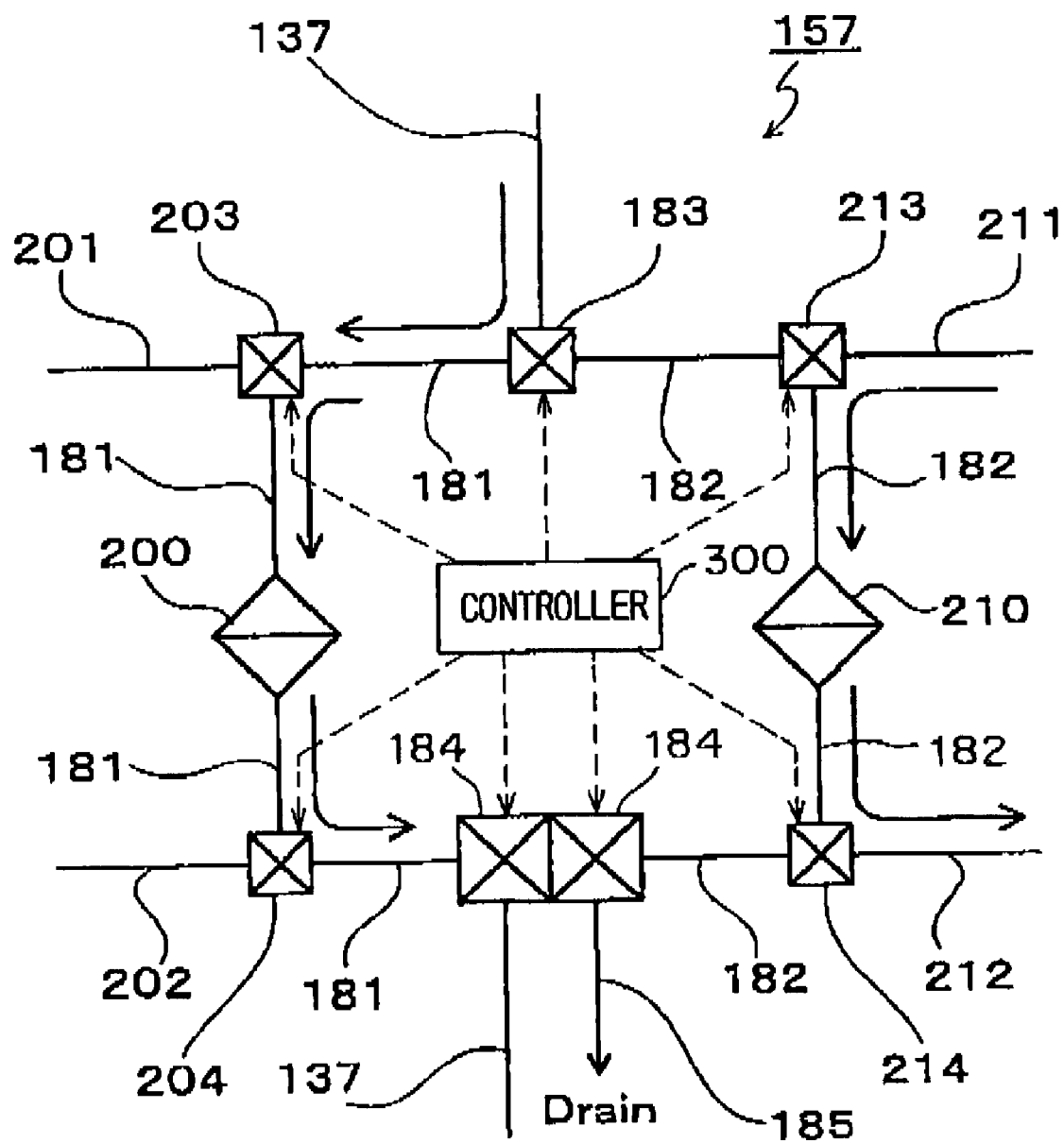
FIG. 8 is an explanatory view of an foreign substance removing part.

As shown in FIG. 8, the foreign substance removal part 157 comprises a first foreign substance removal line 181 and a second foreign substance removal line 182 juxtaposed and interposed in the chemical recovery path 137. A switching valve 183 is arranged at the junction (diverging point) of the first foreign substance removal line 181 and the second foreign substance removal line 182. The switching valve 183 can switch an object communicating with the chemical recovery path 137 from the first foreign substance removal line 181 to the second foreign substance removal line 182, and vice versa. A switching valve 184 is arranged at the junction (confluence) of the first foreign substance removal line 181 and the second foreign substance removal line 182. The switching valve 184 can also switch an object communicating with the chemical recovery path 137 from the first foreign substance removal line 181 to the second foreign substance removal line 182, and vice versa. Accordingly, the chemical liquid flowing in the chemical recovery path 137 selectively runs in either one of the first foreign substance removal line 181 and the second foreign substance removal line 182 due to the switching operation of the switching valve 183 and thereafter, the same liquid again flows in the chemical recovery path 137 due to the switching operation of the switching valve 184.

In the first foreign substance removal line 181, a filter 200 is interposed to remove the foreign substances from the chemical liquid. Further, the first foreign substance removal line 181 is provided with a solution supply path 201 for supplying the filter 200 with a solution for dissolving the foreign substances and a solution drain path 202 for discharging the solution. For example, nitric acid ($HNO_3$) is used as the solution for dissolving the foreign substances. It may be replaced with acetic acid ($CH_3COOH$), hydrogen peroxide ($H_2O_2$) or the like. The solution supply path 201 is connected to the first foreign substance removal line 181 through a valve 203, while the solution drain path 202 is connected to the first foreign substance removal line 181 through a valve 204 similarly. In the first foreign substance removal line 181; the valve 203 is interposed between the switching valve 183 and the filter 200. The valve 203 can switch the flowing of liquid from a condition where the solution supply path 201 is closed so that the chemical liquid flows from the valve 183 into the filter 200 to another condition where the solution supply path 201 communicates with the first foreign substance removal line 181 to allow the solution to flow into the filter 200, and vice versa. In the first foreign substance removal line 181, the valve 204 is interposed between the switching valve 184 and the filter 200. The valve 204 can switch the flowing of liquid from a condition where the solution drain path 202 is closed so that the chemical liquid flows from the filter 200 into the valve 184 to another condition where the solution drain path 202 communicates with the first foreign substance removal line 181 to allow the solution to flow from the filter 200 into the solution drain path 202, and vice versa.

In the second foreign substance removal line 182, a filter 210 is interposed to remove the foreign substances from the chemical liquid. Further, the second foreign substance removal line 182 is provided with a solution supply path 211 for supplying the filter 210 with a solution for dissolving the foreign substances and a solution drain path 212 for discharging the solution. The solution supply path 211 is connected to the second foreign substance removal line 182 through a valve 213, while the solution drain path 212 is connected to the second foreign substance removal line 182 through a valve 214 similarly. In the second foreign substance removal line 182, the valve 213, is interposed between the switching valve 183 and the filter 210. The valve 213 can switch the flowing of liquid from a condition where the solution supply path 211 is closed so that the chemical liquid flows from the valve 213 into the filter 210 to another condition where the solution supply path 211 communicates with the second foreign substance removal line 112 to allow the solution to flow into the filter 210, and vice versa. In the second foreign substance removal line 182, the valve 214 is interposed between the switching valve 184 and the filter 210. The valve 214 can switch the flowing of liquid from a condition where the solution drain path 212 is closed so that the chemical liquid flows from the filter 210 into the valve 184 to another condition where the solution drain path 212 communicates with the second foreign substance removal line 182 to allow the solution to flow from the filter 210 into the solution drain path 212, and vice versa.

The foreign substance removal part 157 includes a control unit 300. The control unit 300 controls the operations of the switching valves 183, 184 and the other valves 203, 204, 213, 214.

The foreign substance removal part 157 operates as follows. The following operation is carried out since the control unit 300 controls the operations of the switching valves 183, 184 and the other valves 203, 204, 213, 214.

Figure 9:
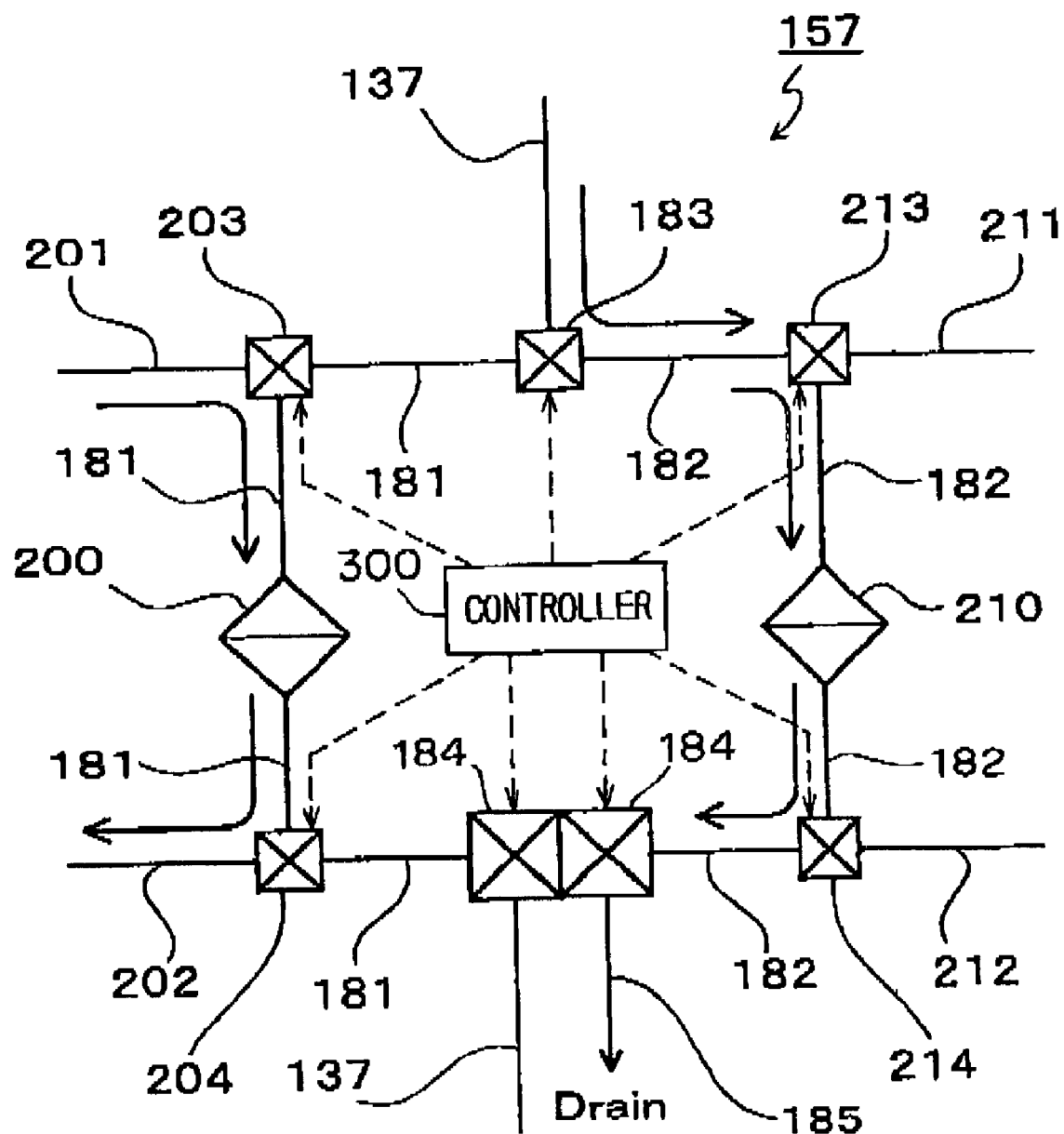
FIG. 9 is an explanatory view of a process of cleaning a filter.

The chemical liquid that has passed the chemical recovery path 137 passes either the first foreign substance removal line 181 or the second foreign substance removal line 182 owing to the switching operation of the switching valve 183. If the switching valve 183 switches to the first foreign substance removal line 181, then the chemical liquid passes through the filter 200. Then, as the valves 203 closes the solution supply path 201, there is no possibility that the chemical liquid flows into the solution supply path 201 and the solution flows into the first foreign substance removal line 181. Since the filter 200 allows the chemical liquid through, the foreign substances are removed from the chemical liquid. The foreign substances on removal are accumulated in the filter 200. The chemical liquid after passing the filter 200 flows from the first foreign substance removal line 181 into the chemical recovery path 137 via the valve 184. Then, as the valves 204 closes the solution drain path 202, there is no possibility that the chemical liquid flows into the solution drain path 202 and the solution flows into the first foreign substance removal line 181. Here, when an accumulation of the foreign substances in the filter 200 increases with an increase of the number of processed wafers, the filtering function of the filter 200 is deteriorated. Therefore, it is carried out to make the chemical liquid pass through the second foreign substance removal line 182 by the switching operation of the switching valve 183, as shown in FIG. 9. As a result, the chemical liquid passes through the filter 210, so that it traps the foreign substances in the chemical liquid. The foreign substances on removal are accumulated in the filter 210. The chemical liquid after passing the filter 210 flows from the second foreign substance removal line 182 into the chemical recovery path 137 via the valve 184. Then, as the valves 213 closes the solution supply path 211, there is no possibility that the chemical liquid flows into the solution supply path 211 and the solution flows into the second foreign substance removal line 182. Again, as the valves 214 closes the solution drain path 212, there is no possibility that the chemical liquid flows into the solution drain path 212 and the solution flows into the second foreign substance removal line 182.

While, the foreign substances accumulated in the filter 200 are dissolved by the solution. Thus, upon switching a filter allowing the chemical liquid through from the filter 200 to the filter 210, it is carried out to clean the filter 200 by the solution supplied through the solution supply path 201 as the cleaning means.

As shown in FIG. 9, the valve 203 is opened to allow the solution for dissolving the foreign substances to flow in the solution supply path 201 and flow into the first foreign substance removal line 181. In this way, the solution is supplied into the filter 200. At the filter 200, the foreign substances on accumulation are dissolved by the solution, so that the solution having the foreign substances dissolved therein flows in the first foreign substance removal line 181. As the valve 204 has been switched so as to allow the solution to flow into the solution drain path 202, the solution is discharged from the first foreign substance removal line 181 into the solution drain path 202. In this way, owing to the dissolution of the foreign substances by the solution, it becomes possible to clean up the filter 200. It is also possible to clean up the filter 200 while the foreign substances are being accumulated in the filter 210. By operating the switching valve 183 before the filtering function of the filter 210 is deteriorated, it is possible to allow the chemical liquid to pass through the first foreign substance removal line 181, as shown in FIG. 8. The so-cleaned filter 200 is capable of removing the foreign substances from the chemical liquid.

Although an accumulation of the foreign substances in the filter 200 increases with an increase of the number of processed wafers, the foreign substance accumulated in the filter 200 are dissolved by the solution in the meantime. Thus, upon switching a filter allowing the chemical liquid through from the filter 210 to the filter 200, it is carried out to clean the filter 210 by the solution supplied through the solution supply path 211 as the cleaning means.

As shown in FIG. 8, the valve 213 is opened to allow the solution for dissolving the foreign substances to flow in the solution supply path 211 and flow into the second foreign substance removal line 182. In this way, the solution is supplied into the filter 210. At the filter 210, the foreign substances on accumulation are dissolved by the solution, so that the solution having the foreign substances dissolved therein flows in the second foreign substance removal line 182. As the valve 214 has been switched so as to allow the solution to flow into the solution drain path 212, the solution is discharged from the second foreign substance removal line 182 into the solution drain path 212. In this way, owing to the dissolution of the foreign substances by the solution, it becomes possible to clean up the filter 210. It is also possible to clean up the filter 210 while the foreign substances are being accumulated in the filter 200. By operating the switching valve 183 before the filtering function of the filter 200 is deteriorated, it is possible to allow the chemical liquid to pass through the second foreign substance removal line 182, as shown in FIG. 9. The so-cleaned filter 210 is capable of removing the foreign substances from the chemical liquid. In this way, the foreign substances are eliminated in the foreign substance removal part 157 certainly. Thus, it is possible to prevent the chemical feed line 155 from being blocked, on the downstream side of the foreign substance removal part 157, by the foreign substances. Additionally, by executing the switching between the valve 183 and the valve 184 continuously, it becomes possible to accomplish both of the removal of foreign substances in the chemical liquid and the cleaning of the filters 200, 210 without interrupting the liquid-feeding process through the chemical recovery path 137.

Figure 10:
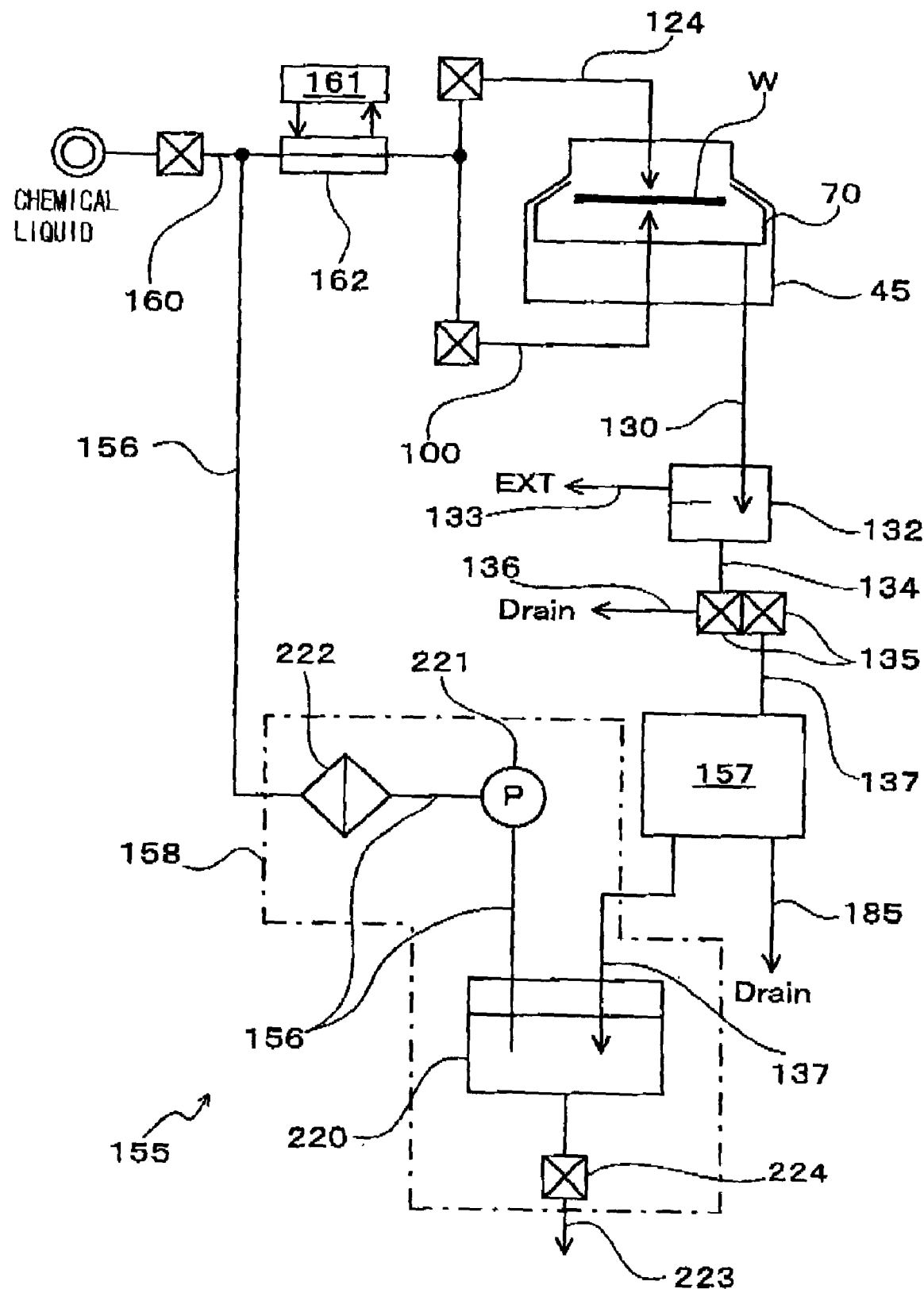
FIG. 10 is an explanatory view of a chemical circulatory mechanism.

As shown in FIG. 10, the chemical circulatory unit 158 includes a tank 220, a pump 221 and a main filter 222. The chemical recovery path 137 is connected with the tank 220. The tank 220 is equipped with the chemical circulatory path 156 and a drain pipe 223 having a valve 224. The pump 221 and the main filter 222 are interposed in the chemical circulatory path 156. It is preferable that the main filter 222 has a small-mesh net in comparison with respective nets of the filters 200, 210. The chemical liquid fed to the chemical circulatory unit 158 through the chemical recovery path 137 is collected by the tank 220. The pump 221 sucks up the chemical liquid in the tank 220 and allows the so-sucked liquid to pass through the main filter 222. The main filter 222 removes fine muddy substances from the chemical liquid to clean it for reuse. Then, the cleaned chemical liquid passes through the chemical circulatory path 156 and flows into the chemical supply path 160. Since the main filter 222 is positioned on the downstream side of the foreign substance removal part 157 for removing the foreign substances from the chemical liquid, it is possible to prevent the main filter 222 from being obstructed by the foreign substances. Thus, it is possible to prolong the life span of the main filter 222.

Note that the constitution of the foreign substance removal part 167 in the IPA feed line 165 is similar to that of the foreign substance removal part 157 in the chemical feed line 155. The constitution of the IPA circulatory unit 180 is similar to that of the chemical circulatory unit 153.

The other substrate cleaning units 13, 14, 15 in the cleaning system I have constitutions each similar to that of the above-mentioned substrate cleaning unit 12, allowing both faces of the wafer W to be cleaned simultaneously.

Now, in the cleaning system 1, a not-shown transfer robot first lays the carriers C each accommodating the wafers W, for example, twenty-five wafers W on the in/out port 4. Next, the pickup/accommodating arm 11 takes the wafers W out of the carrier C mounted on the in/out port 4 one by one and successively delivers the wafer W to the main wafer transfer unit 7. Next, by the transfer arm 34, the wafers W are appropriately brought into the substrate processing unit 12, 13, 14, 15 where the contaminants, such as particles, are removed from the wafers W. In this way, the wafers W after completing the designated cleaning process are suitably unloaded from the substrate processing units 12, 13, 14, 15 by main wafer transfer unit 7. Subsequently, the wafers W are delivered to the loaded pickup/accommodating arm 11 one by one and successively accommodated in the carrier C again.

We now describe the cleaning operation at the substrate processing unit 12 representatively. AS shown in FIG. 4, the "unit-chamber" mechanical shutter 51 of the substrate processing unit 12 and the "outer-chamber" mechanical shutter 53 of the outer chamber 46 open together. Then, the transfer arm 34 carrying the wafer W enters the unit. The inner cup 70 is lowered to project the chuck body 75 relatively upward. As shown in FIG. 4, the under plate 77 falls in advance to occupy its withdrawal position in the chuck body 75. The top plate 72 rises in advance to occupy its withdrawal position.

The main wafer transfer unit 18 allows the transfer arm 34 to move horizontally and deliver the wafer W to the spin chuck 71. The spin chuck 71 supports the wafer W by means of not-shown support pins. Then, the wafer W is supported so as to direct its surface for semiconductor devices upward. Since the under plate 77 has been moved to the withdrawal position apart from a level (height) of the wafer W held by the spin chuck 71, the transfer arm 34 can deliver the wafer W to the spin chuck 71 with composure. After delivering the wafer W to the spin chuck 71, the transfer arm 34 withdraws from the interior of the outer chamber 46 and the interior of the "unit-chamber" mechanical shutter 51. After the withdrawal of the transfer arm 34, both of the "unit-chamber" mechanical shutter 51 for the substrate processing unit 12 and the "outer-chamber" mechanical shutter 53 of the outer chamber 46 are together closed.

Figure 11:
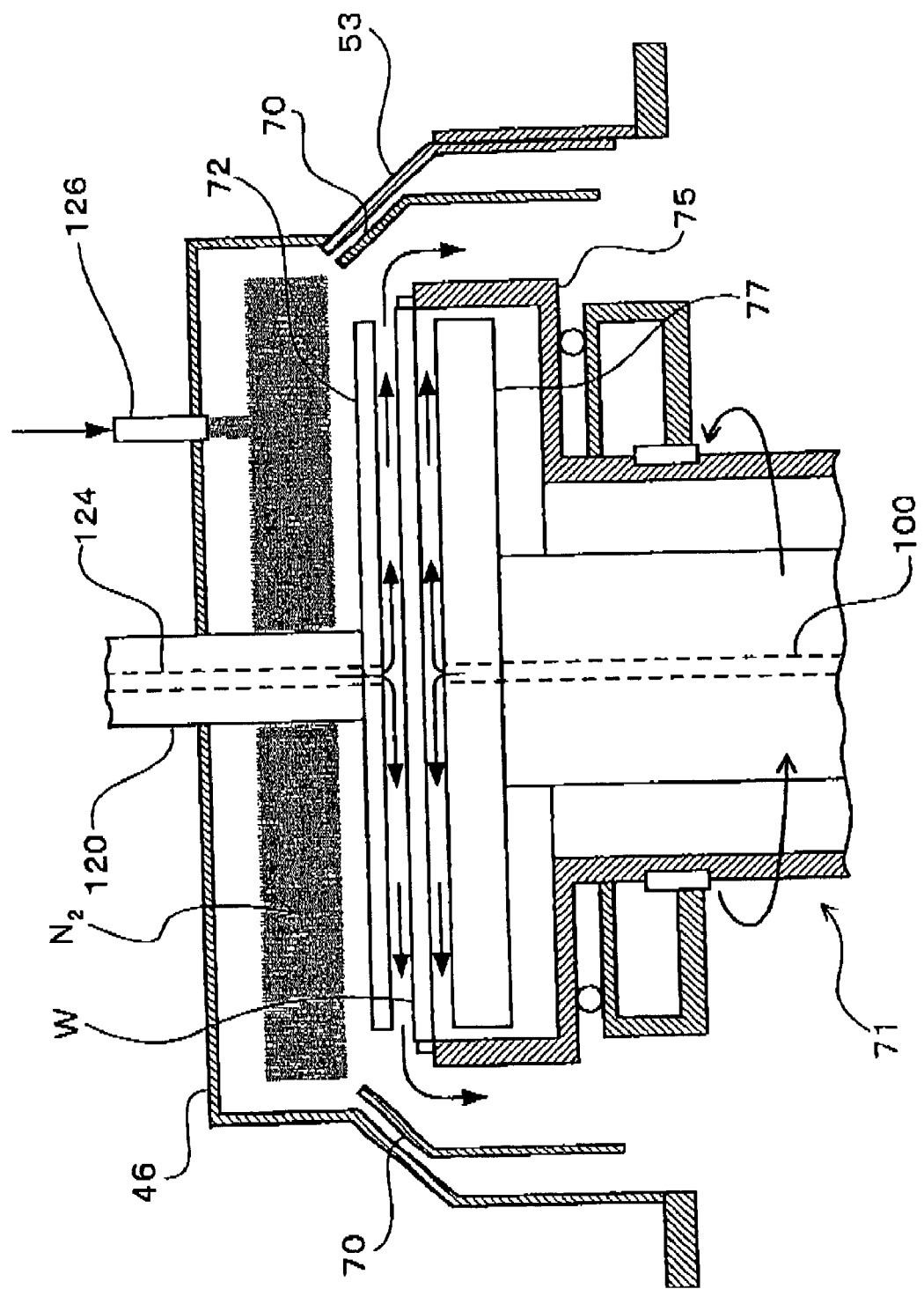
FIG. 11 is an explanatory view of a process of cleaning a wafer with a chemical liquid.

The inner cup 70 is elevated to surround the chuck body 75 and the wafer W. As shown in FIG. 11, the top plate 72 falls to the processing position in the chuck body 75. Consequently, there is produced a clearance (for example, a clearance on the order of 0.5–3 [mm]) between the top plate 72 at the processing position and the upper face (surface) of the wafer W held by the spin chuck 71. On the other hand, the under plate 77 rises to the processing position in the chuck body 75. Consequently, there is produced a clearance (for example, a clearance on the order of 0.5–3 [mm]) between the under plate 77 at the processing position and the lower face (back face) of the wafer W held by the spin chuck 71.

Next, the "top-plate" heat regulator heats the top plate 72 to a predetermined temperature. Again, the "under-plate" heat regulator heats the top plate 77 to a predetermined temperature. When the top plate 72 and the under plate 77 reach the predetermined temperature, the spin chuck 71 rotates and the holding members 80 hold the periphery of the wafer W from outside due to centrifugal force, so that the wafer W is rotated. Then, the chemical liquid is supplied to the wafer W through the upper supply path 124 and the lower supply path 100, performing the cleaning operation of the wafer W. The chemical liquid is supplied by the circulatory mechanism shown in FIG. 7. The unused chemical liquid and the chemical liquid collected by the chemical circulatory unit 158 is supplied from the chemical supply path 160 to the wafer W through the upper supply path 124 and the lower supply path 100.

As shown in FIG. 11, the chemical liquid is supplied in the vicinity of the center of the wafer W and subsequently flows toward the circumference of the wafer W due to a centrifugal force by the rotation of the wafer W. While cleaning the wafer W, a gap between the top plate 72 and the upper face (wafer surface) of the wafer W and another gap between the under plate 77 and the lower face (back surface) of the wafer W can be filled with the chemical liquid only because of their narrowness. Therefore, it is possible to precisely and quickly elevate the temperature of the wafer W in spite of a small quantity of chemical liquid. Note that the top plate 72 and the under plate 77 do not come into contact with the upper face and the lower face of the wafer W respectively. Additionally, the sizes of both gaps are substantially equal to each other. That is, since there is produced no local temperature difference on the wafer W and the surface side of the wafer W is similar to the back side of the wafer W in terms of temperature of the chemical liquid, it is possible to elevate the temperature of the whole wafer W uniformly.

As shown in FIG. 5, the chemical liquid flowing toward the circumference of the wafer W is drained into the inner cup 70 and discharged therefrom through the "inner-cup" drain pipe 130. Subsequently, air bubbles etc. are separated from the chemical liquid in the "inner-cup" mist trap 132 and exhausted from the "inner-cup, mist trap 132 through the "mist-trap" exhaust pipe 133. The chemical liquid flowing in the "inner-cup" drain pipe 134 passes through the chemical recovery path 137 due to the operation of the switching valve 135. Thereafter, the chemical liquid circulates in the chemical feed line 155 of FIG. 7. The removal of foreign substances is performed by the foreign substance removal part 157, while the chemical liquid is collected and cleaned by the chemical circulatory unit 158. In the foreign substance removal part 157, when the flow of the chemical liquid is switched to the first foreign substance removal line 181, the chemical liquid passes through the filter 200, so that the foreign substances are accumulated in the filter 200. In the above way, the chemical liquid used for cleaning the wafer W is collected and subsequently used for the cleaning operation of the wafer W again. Accordingly, it is possible to reduce the chemical consumption.

During the cleaning operation, the $N_2$-gas supplier 126 at the top of the outer chamber 46 supplies $N_2$-gas onto the top plate 72 to form downward flows of $N_2$-gas. Since a space between the upper face of the top plate 72 and the outer chamber 46 is filled up with $N_2$-gas, the chemical atmosphere rising around the top plate 72 by the evaporation of a chemical liquid film does not enter the space above the top plate 72. Therefore, it is possible to prevent the chemical liquid from remaining in the upper part of the outer chamber 46 after completing the chemical processing. Additionally, the supply of $N_2$-gas has an effect to prevent an occurrence of watermarks on the wafer W.

After completing the chemical processing on both faces of the wafer W, the top plate 72 rises to the withdrawal position. After that, the "nozzle-housing" shutter 56 opens and the processing-liquid nozzle 60 pivots above the wafer W. The processing-liquid nozzle 60 supplies $N_2$-gas for e.g. ten seconds while scanning from the center of the rotating wafer W to the periphery, at least. As a result, it is possible to drive the liquid drops of the chemical liquid to the circumference of the wafer W. On the other hand, $N_2$-gas is supplied into the gap between the under plate 77 and the lower face of the wafer W through the lower supply path 100 for e.g. ten seconds, removing the liquid drops from the lower face of the wafer W. In this way, the supply of $N_2$-gas allows the drops of the chemical liquid to be removed from both faces of the wafer W. As shown in FIG. 5, the chemical liquid drops are drained into the inner cup 70 and discharged therefrom through the "inner-cup" drain pipe 130. Subsequently, $N_2$-gas and air bubbles are removed in the "inner-cup" mist trap 132 and the chemical liquid is discharged therefrom through the "inner-cup" drain pipe 134. The chemical liquid flowing in the "inner-cup" drain pipe 134 passes through the chemical recovery path 137 due to the operation of the switching valve 135. Thereafter, the chemical liquid is collected for reuse by the circulatory mechanism shown in FIG. 7. Thus, the saving in chemical consumption can be accomplished.

The processing-liquid nozzle 60 supplies the IPA liquid to the upper face of the wafer W while scanning from the center of the rotating wafer W to the periphery, at least. The IPA liquid is supplied between the under plate 77 and the lower face of the wafer W through the lower supply path 100. The IPA liquid is supplied by the mechanism of FIG. 7. By the supply-switching valve 170, it is possible to switch the IPA liquid between the unused PA liquid (pur) supplied through the IPA supply path 172 and the IPA liquid for recycle (rec) collected by the IPA circulatory unit 168 and supplied from the IPA feed line 165. As shown in FIG. 6, the IPA drops are discharged into the outer chamber 46 and successively discharged therefrom through the outer-chamber" drain pipe 140. Thereafter, the air bubbles are eliminated in the "outer-chamber" mist trap 142. The IPA liquid is drained from the mist trap 142 through the "outer-chamber" drain pipe 144. The IPA liquid flowing in the "outer-chamber" drain pipe 144 passes through the IPA recovery path 147 due to the operation of the switching valve 145. Thereafter, the IPA liquid is collected for recycle by the circulatory mechanism of FIG. 7. In this way, the IPA consumption can be saved.

Next, the processing-liquid nozzle 60 supplies the pure water to the upper face of the wafer W while scanning from the center of the rotating wafer W to the periphery, at least. Since the pure water is supplied to the wafer W rotating at revolutions of e.g. 500 to 1000 rpm, it is possible to disperse the pure water all over the top of the wafer W uniformly. Also, the lower supply path 100 supplies the pure water to the lower face of the wafer W. Owing to the supply of pure water to the wafer W rotating at a high speed, it is possible to disperse the pure water all over the bottom of the wafer W uniformly. Additionally, it is also possible to clean the under plate 77 per se. In this way, it is carried out to rinse both faces of the wafer W, washing the chemical liquid from the wafer W. The pure water on supply is drained through the "outer-chamber" drain pipe 140. Note that the above-mentioned rinsing operation with pure water may be eliminated dependently of the nature of the chemical liquid on use.

After completing the rinsing operation, the wafer W is rotated at a high speed (e.g. the order of 1500 rpm) in comparison with the rotating speed in the rinsing process, performing a spin drying process. Then, $N_2$-gas is supplied to the upper face of the wafer W by the processing-liquid nozzle 60. While, the lower supply path 100 supplies $N_2$-gas to the lower face of the wafer W. It is also possible to carry out the drying of the under plate 77 simultaneously.

After the drying process, the processing-liquid nozzle 60 moves into the nozzle housing 47 and the under plate 77 falls to the withdrawal position. Subsequently, the wafer W is unloaded out of the substrate cleaning unit 12. The "unit-chamber" mechanical shutter 53 and the "outer-chamber" mechanical shutter 51 open and the wafer transfer unit 18 allows the transfer arm 34 to enter into the unit 12 to support the lower face of the wafer W. Next, the transfer arm 34 receives the wafer W from the support pins of the spin chuck 71 and continuously withdraws from the unit 12. During this process, since the under plate 77 is lowered at the withdrawal position, there is produced a sufficient clearance between the under plate 77 and the wafer W held by the spin chuck 71, allowing the transfer arm 34 to receive from the spin chuck 71 with composure.

Thereafter, by e.g. the transfer arm 35, the uncleanness wafer W' is loaded into the substrate cleaning unit 12 where the contaminants, such as particles, are removed from the wafer W'. The wafer W' on completion of the designated cleaning process is appropriately discharged from the substrate cleaning unit 12 by the main wafer transfer unit 7 again. The above-mentioned wafer cleaning process is repeated in the substrate cleaning unit 12 by several times.

A quantity of foreign substance accumulated in the filter 200 increases corresponding to the number of wafers to be cleaned. Therefore, by switching the switching valve 183, the chemical liquid is introduced to the second foreign substance removal line 182, as shown in FIG. 9. The filter 210 separates the foreign substances from the chemical liquid. The foreign substances are accumulated in the filter 210, while the chemical liquid flows into the chemical recovery path 137 through the valve 184. On the other hand, the filter 200 is cleaned by means of the solution supply path 201 as the cleaner. The solution is supplied into the filter 200, so that the foreign substances accumulated in the filter 200 are dissolved by the solution. The solution having the foreign substances dissolved therein is discharged into the solution drain path 202. While a quantity of foreign substances accumulated in the filter 210 is increasing corresponding to the number of wafers W to be cleaned, the filter 200 is cleaned to provide a new filter allowing of filtering of the chemical liquid. Before the filtering function of the filter 210 is deteriorated, the operation of the switching valve 183 is switched to allow the chemical liquid to pass through the first foreign substance removal line 191, as shown in FIG. 8. Although a quantity of foreign substances accumulated in the filter 200 increases with an increase in the number of cleaned wafers, the filter 200 is cleaned for a new filter capable of filtering the chemical liquid in the meantime. Therefore, it is possible to accomplish the removal of foreign substances in the chemical liquid and the cleaning of the filters 200, 201 without interrupting a feeding process through the chemical recovery path 137.

Figure 12:
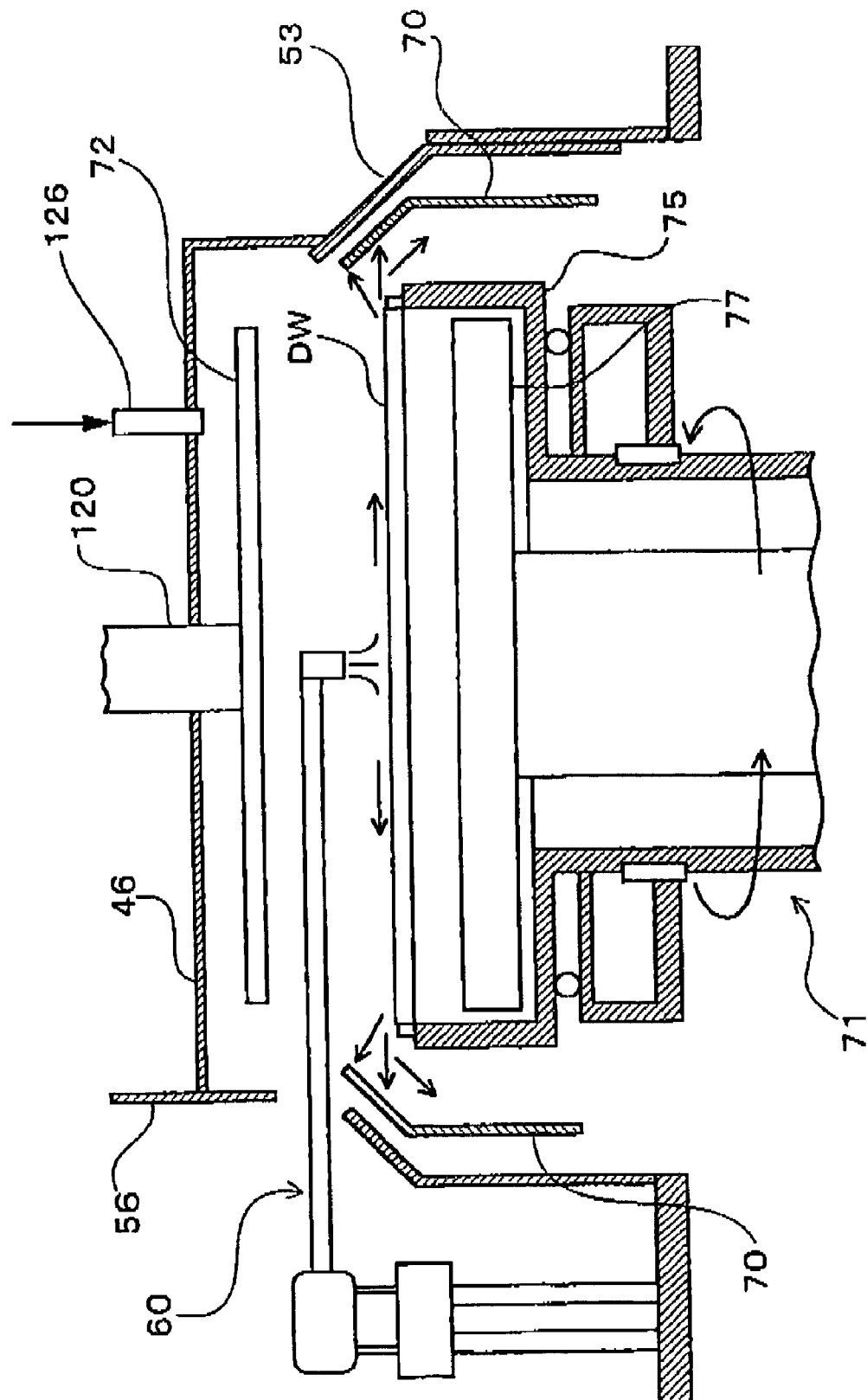
FIG. 12 is an explanatory view of a process of cleaning the inner cup.

During the cleaning process of the wafer W, the chemical liquid scatters to adhere to the inner cup 70. Since the foreign substances adhering to the inner cup 70 increases with the increased number of processed wafer W, there is periodically performed an inner-cup cleaning process to eliminate the foreign substances. It is carried out to load a dummy wafer DW into the substrate cleaning unit 12. In the unit 12, the dummy wafer DW is held by the spin chuck 71. Then, it rotates the dummy wafer DW. As shown in FIG. 12, the processing-liquid nozzle 60 is shifted to the vicinity of the center of the dummy wafer DW to eject the solution for the foreign substances to the rotating dummy wafer DW. Then, the solution flows toward the circumference of the dummy wafer DW vigorously. Additionally, since the solution scatters against the foreign substances sticking to the inner cup 70, it becomes possible to remove them from the inner cup 70 consequently. Note, if the "outer-chamber" mechanical shutter 53 is closed so that an atmosphere inside the outer chamber 46 does not leak out, then it becomes possible to clean the interior side of the inner cup 70. For example, hydrogen peroxide ($H_2O_2$) is employed as the solution for dissolving the foreign substances. It may be replaced by nitric acid ($HNO_3$), acetic acid ($CH_3COOH$) or the like.

According to the substrate cleaning unit 12 mentioned above, it is possible to prevent the chemical teed line 155 from being blocked, on the downstream side of the foreign substance removal part 157, by the foreign substances. Additionally, both removal of foreign substances from the chemical liquid and cleaning of the filters 200, 201 can he performed without interrupting the liquid-feeding process through the chemical recovery path 137. Further, it is possible to prevent the main filter 222 from being blocked with the foreign substances.

Although the present invention has been described by one example of preferred embodiments, the invention is not limited to the above-mentioned embodiment only. For instance, in the foreign substance removal part 167, the first foreign substance removal line 181 and the second foreign substance removal line 182 may be respectively provided with a plurality of filters. For example, as shown in FIG. 13, the first foreign substance removal line 181 includes filters 200a, 200b, while the second foreign substance removal line 182 includes filters 210a, 210b. In the first foreign substance removal line 181, the filter 200a on the upstream side is adapted so as to allow removal of the foreign substances larger than those that the other filter 200b on the downstream side can remove. Again, in the second foreign substance removal line 182, the filter 210a on the upstream side is adapted so as to allow removal of the foreign substances larger than those that the other filter 210b on the downstream side can remove.

Without recycling the chemical liquid, the circulatory mechanism may be directed to reuse only the processing liquid discharged from the substrate processing unit 12. In this case, since the waste liquid from the substrate cleaning unit 12 does not include the foreign substances, it is possible to prevent other units, teed pipes, etc. besides the unit 12 from being blocked with the foreign substances. For instance, in the chemical feed line 155 of FIG. 10, if the processing liquid is drained from the drain pipes. 185, 223, the it becomes possible to prevent units, feed pipes, etc. on the downstream side of the pipes 185, 223 from being blocked with the foreign substances because they have been removed by the foreign substance removal part 157.

The foreign substance removal part 167 may be formed by a single foreign substance removal line having no diverging point. In detail, the chemical recovery path 137 is provided with a filter for removing the foreign substance from the processing liquid. As the cleaner for cleaning this filter, a solution supply line is connected to the upstream side of the filter, while a solution drain line is connected to the downstream side of the filter, establishing an foreign substance removal line. In this modification, the processing liquid passes through the filter when processing the wafer W. When the wafer W is not processed, it is carried out to clean the filter in the meantime. For example, during the cleaning process of the wafer W, the chemical liquid flows in the chemical recovery path 137, so that the filter in the path 137 removes the foreign substances from the chemical liquid. After completing the cleaning process, it is carried out to clean the filter while supplying the cleaned wafer W with the IPA liquid or the pure water. Alternatively, the filter may be cleaned after the cleaned wafer W has been unloaded out of the substrate cleaning unit 12. In the above way, it becomes possible to clean the filter interposed in the chemical recovery path 137 during a standstill of the cleaning operation in the unit 12. Also in this case, with the prevention of the blocking in the main filter 222, it is possible to lengthen the life span of the main filter 222. Additionally, it is possible to prevent units, feed pipes, etc. (e.g. the chemical circulatory path 156, the drain pipe 185, the drain pipe 185) on the downstream side of the foreign substance removal line from being blocked with the foreign substances. That is, since there is no need to exchange the main filter 222 frequently and the cleaning operation for the units, the feed pipes, etc. on the downstream side of the foreign substances removal line does not require an interruption of the processing of wafer W, it is possible to improve the whole throughput in processing the wafers W.

As to the cleaning process of the inner cup, the ejection of the foreign substance solution against the dummy wafer DW may be replaced with the ejection of the foreign substance solution against the top plate 72. For example, the top plate 72 is lowered to the processing position of FIG. 11. Further, the processing-liquid nozzle 60 is shifted to the vicinity of the top plate 72 and the foreign substance solution is ejected to the rotating top plate 72. Then, the foreign substance solution flows toward the circumference of the top plate 72 vigorously. Additionally, since the solution scatters against the foreign substances sticking to the inner cup 70, it becomes possible to remove them from the inner cup 70 consequently.

The present invention is applicable to not only a substrate cleaning apparatus to which the cleaning liquid is supplied but also a substrate processing apparatus for the application of other treatments on the substrate besides the cleaning of the substrate. Additionally, a substrate as the object to be processed is not limited to a semiconductor wafer only. Thus, the semiconductor may be replaced with the other substrate, for example, substrate for LCD glass, CD substrate, print baseplate, ceramic substrate, etc. Without limiting the substrate processing apparatus to a single-wafer processing type apparatus of the above-mentioned embodiments, it may be alternatively selected from a variety of substrate processing apparatuses, for example, batch-type, spin-type, etc.

According to the present invention, it is possible to remove the foreign substances from the processing liquid. It is possible to prevent the processing-liquid feed line from being blocked with the foreign substances. It is possible to clean the filters. It is possible to accomplish both removal of foreign substances in the processing liquid and cleaning of the filters without interrupting the feeding process. It is possible to prevent the main filter from being clogged with the foreign substances.

What is claimed is:

1. A substrate processing apparatus comprising:
   a substrate processing part for processing a substrate by a processing liquid;
   a processing-liquid recovery path through which the processing liquid is discharged from the substrate processing part, wherein the processing-liquid recovery path has a plurality of foreign substance removal lines connected with each other in parallel, the plural foreign substance removal lines being selectively adapted so as to allow the processing liquid to flow through a filter thereof; and
   and a cleaner for cleaning the filter, wherein the cleaner comprises a cleaner solution capable of dissolving the foreign substance mixed into the processing liquid and a flow path system for flow therethrough of the cleaning solution.

2. A substrate processing apparatus as claimed in claim 1, wherein the foreign substance to be dissolved is a resist having its nature changed.

3. A substrate processing apparatus as claimed in claim 1, wherein the cleaner solution for dissolving the foreign substance is any one of hydrogen peroxide, nitric acid and acetic acid.

4. A substrate processing apparatus as claimed in claim 1, wherein the processing-liquid recovery path is adapted so as to supply the processing liquid that has passed through the foreign substance removal line to the substrate processing part, in view of reusing the processing liquid.

5. A substrate processing apparatus as claimed in claim 1, wherein the processing-liquid recovery path has a main filter arranged on the downstream side of the foreign substance removal line to clean the processing liquid.

6. A substrate processing apparatus, comprising:
a substrate processing part for processing a substrate by a processing liquid;
a processing-liquid recovery path through which the processing liquid is discharged from the substrate processing part, the processing-liquid recovery path including a foreign substance removal line having a filter for removing a foreign substance from the processing liquid discharged from the substrate processing part;
a cleaner for cleaning the filter, wherein the cleaner comprises a cleaner solution capable of dissolving the foreign substance mixed into the processing liquid and a flow path system for flow therethrough of the cleaning solution; and
a control unit that controls so as to switch the passage of the processing liquid from one foreign substance removal line to the other foreign substance removal line before the filter in the one foreign substance removal line is deteriorated in terms of its filtering function.

7. A substrate processing apparatus, comprising:
a substrate processing part for processing a substrate by a processing liquid;
a processing-liquid recovery path through which the processing liquid is discharged from the substrate processing part, the processing-liquid recovery path including a foreign substance removal line having a filter for removing a foreign substance from the processing liquid discharged from the substrate processing part; and
a cleaner for cleaning the filter, wherein the cleaner comprises a cleaner solution capable of dissolving the foreign substance mixed into the processing liquid and a flow path system for flow therethrough of the cleaning solution;
wherein the flow path system of the cleaner comprises a solution supply path connected to the processing-liquid recovery path on the upstream side of the filter to supply the cleaner solution for dissolving the foreign substance mixed into the processing liquid; and a solution drain path connected to the processing-liquid recovery path on the downstream side of the filter to drain the cleaner solution.

8. A substrate processing apparatus comprising:
a substrate processing part for processing a substrate by a processing liquid;
a processing-liquid recovery path through which the processing liquid is discharged from the substrate processing part, the processing-liquid recovery path including a foreign substance removal line having a filter for removing a foreign substance from the processing liquid discharged from the substrate processing part;
a cleaner for cleaning the filter, wherein the cleaner comprises a cleaner solution capable of dissolving the foreign substance mixed into the processing liquid and a flow path system for flow therethrough of the cleaning solution;
a first valve interposed in the processing-liquid recovery path and arranged on the upstream side of the filter; a second valve interposed in the processing-liquid recovery path and arranged on the downstream side of the filter; a solution supply path connected to the first valve to supply the cleaner solution for dissolving the foreign substance mixed into the processing liquid; a solution drain path connected to the second valve to drain the cleaner solution, the solution supply path and the solution drain path constituting the flow path system of the cleaner; and a control unit for controlling the operations of the first valve and the second valve in a manner that, when removing the foreign substance from the processing liquid by the filter, the control unit allows the processing liquid to pass from the upstream side of the processing-liquid recovery path to the downstream side of the processing-liquid recovery path through the filter and that, when dissolving the foreign substance accumulated in the filter, the control unit allows the cleaner solution to pass from the solution supply path to the solution drain path through the filter in the processing-liquid recovery line.

9. A substrate processing apparatus as claimed in claim 8, further comprising: a third valve interposed in the processing-liquid recovery path and arranged on the downstream side of the second valve; and a processing-liquid drain path connected to the third valve to drain the processing liquid, wherein the control unit controls the operation of the third valve in a manner that, when recovering the processing liquid, the control unit allows the processing liquid to flow from the upstream side of the processing-liquid recovery path to the downstream side of the processing-liquid recovery path through the third valve and that, when draining the processing liquid, the control unit allows the processing liquid to flow from the upstream side of the processing-liquid recovery path to the processing-liquid drain path through the third valve.

10. A substrate processing apparatus, comprising:
a substrate processing part for processing a substrate by a processing liquid;
a processing-liquid recovery path through which the processing liquid is discharged from the substrate processing part, the processing-liquid recovery path including a foreign substance removal line having a filter for removing a foreign substance from the processing liquid discharged from the substrate processing part;
a cleaner for cleaning the filter, wherein the cleaner comprises a cleaner solution capable of dissolving the foreign substance mixed into the processing liquid and a flow path system for flow therethrough of the cleaning solution;
a first valve interposed in the processing-liquid recovery path and arranged on the upstream side of the filter;
a second valve interposed in the processing-liquid recovery path and arranged on the downstream side of the filter;
a solution supply path connected to the first valve to supply a cleaner solution for dissolving the foreign substance mixed into the processing liquid;

a solution drain path connected to the second valve to drain the cleaner solution, wherein the solution supply path and the solution drain path constitute the flow path system of the cleaner;

a control unit for controlling the operations of the first valve and the second valve in a manner that, when removing the foreign substance from the processing liquid by the filter, the control unit allows the processing liquid to pass from the upstream side of the processing-liquid recovery path to the downstream side of the processing-liquid recovery path through the filter and that, when dissolving the foreign substance accumulated in the filter, the control unit allows the cleaner solution to pass from the solution supply path to the solution drain path through the filter in the processing-liquid recovery line;

a fourth valve interposed in the processing-liquid recovery path and arranged on the upstream side of the first valve;

a fifth valve interposed in the processing-liquid recovery path and arranged on the downstream side of the second valve;

a parallel path arranged in parallel with the processing-liquid recovery path to connect the fourth valve with the fifth valve, the parallel path including a parallel-path side filter;

a sixth valve interposed in the parallel path and arranged between the parallel-path side filter and the fourth valve;

a parallel-path side solution supply path connected to the sixth valve to supply the cleaner solution for dissolving the foreign substance mixed into the processing liquid;

a seventh valve interposed in the parallel path and arranged between the parallel-path side filter and the fifth valve; and a parallel-path side solution drain path connected to the seventh valve to drain the cleaner solution, wherein the control unit controls the operations of the first valve, the second valve, the fourth valve, the fifth valve, the sixth valve and the seventh valve in a manner that: when removing the foreign substance from the processing liquid by the filter and also dissolving the foreign substance accumulated in the parallel-path side filter by the cleaner solution, the control unit allows the processing liquid to flow in the processing-liquid recovery path through the fourth valve, the first valve, the filter, the second valve and the fifth valve, in order and also allows the cleaner solution to flow from the parallel-path side solution supply path to the parallel-path side solution drain path via the sixth valve, the parallel-path side filter and the seventh valve, in order; and when removing the foreign substance from the processing liquid by the parallel-path side filter and also dissolving the foreign substance accumulated in the filter by the cleaner solution, the control unit allows the processing liquid to flow in the processing-liquid recovery path through the fourth valve, the sixth valve, the parallel-path side filter, the seventh valve and the fifth valve, in order; and also allows the cleaner solution to flow from the parallel-path side solution supply path to the parallel-path side solution drain path via the first valve, the filter and the second valve, in order.

11. A substrate processing apparatus, comprising:

a substrate processing part for processing a substrate by a processing liquid;

a processing-liquid recovery path through which the processing liquid is discharged from the substrate processing part, the processing-liquid recovery path including a plurality of foreign substance removal lines connected with each other in parallel, the plurality of foreign substance removal lines being selectively adapted so as to allow the processing liquid to flow therethrough, each of the foreign substance removal lines having a filter for removing a foreign substance from the processing liquid discharged from the substrate processing part;

a cleaner for cleaning the filter, wherein the cleaner comprises a cleaner solution capable of dissolving the foreign substance mixed into the processing liquid and a flow path system for flow therethrough of the cleaning solution; and a control unit controlling that the filter is cleaned in one foreign substance removal line through which the processing liquid does not pass, while the processing liquid is passed through the filter in the other foreign substance removal line.

12. A substrate processing apparatus, comprising:

a substrate processing part for processing a substrate by a processing liquid;

a processing-liquid recovery path through which the processing liquid is discharged from the substrate processing part, the processing-liquid recovery path including a foreign substance removal line having a filter for removing a foreign substance from the processing liquid discharged from the substrate processing part; and a cleaner flow path system for flow therethrough of a cleaner solution capable of dissolving the foreign substance mixed into the processing liquid so as to clean the filter, wherein the cleaner flow path system comprises: a solution supply path connected to the processing-liquid recovery path on the upstream side of the filter to supply the cleaner solution for dissolving the foreign substance mixed into the processing liquid, and a solution drain path connected to the processing-liquid recovery path on the downstream side of the filter to drain the cleaner solution.

* * * * *